(12) United States Patent
O'Quinn et al.

(10) Patent No.: US 8,623,687 B2
(45) Date of Patent: Jan. 7, 2014

(54) METHODS OF FORMING THERMOELECTRIC DEVICES INCLUDING CONDUCTIVE POSTS AND/OR DIFFERENT SOLDER MATERIALS AND RELATED METHODS AND STRUCTURES

(75) Inventors: Brooks O'Quinn, Mamers, NC (US); Rama Venkatasubramanian, Cary, NC (US); Edward Siivola, Raleigh, NC (US)

(73) Assignee: Nextreme Thermal Solutions, Inc., Durham, NC (US)

( * ) Notice: Subject to any disclaimer, the term of this patent is extended or adjusted under 35 U.S.C. 154(b) by 1682 days.

(21) Appl. No.: 11/472,032

(22) Filed: Jun. 21, 2006

(65) Prior Publication Data
US 2006/0289052 A1    Dec. 28, 2006

Related U.S. Application Data

(60) Provisional application No. 60/692,864, filed on Jun. 22, 2005.

(51) Int. Cl.
*H01L 21/00* (2006.01)
*H01L 35/34* (2006.01)
*H01L 35/02* (2006.01)

(52) U.S. Cl.
USPC ............................ 438/54; 136/201; 136/230

(58) Field of Classification Search
USPC .......... 136/201, 230; 438/22–47, 55, 68, 113, 438/458, 460–465, 54; 257/930
See application file for complete search history.

(56) References Cited

U.S. PATENT DOCUMENTS

| 3,136,134 | A |   | 6/1964 | Smith |
| 3,296,034 | A |   | 1/1967 | Reich |
| 3,607,444 | A |   | 9/1971 | DeBucs |
| 3,663,307 | A |   | 5/1972 | Mole |
| 3,859,143 | A |   | 1/1975 | Krebs |
| 4,443,650 | A | * | 4/1984 | Takagi et al. .................. 136/211 |

(Continued)

FOREIGN PATENT DOCUMENTS

| EP | 0 687 020 |    | 12/1995 |
| EP | 0 687 020 | A1 | 12/1995 |

(Continued)

OTHER PUBLICATIONS

Kitano, Yukishige, "Crystal Structure of Polyimides. Application of Molecular Simulation Technique to Calculate the Crystal Structure", 1994, Journal of Photopolymer Science and Technology, vol. 7 No. 2, pp. 257-260.*

(Continued)

*Primary Examiner* — Tamir Ayad
(74) *Attorney, Agent, or Firm* — Myers Bigel Sibley & Sajovec, P.A.

(57) ABSTRACT

A method of forming a thermoelectric device may include forming a first electrically conductive trace, and bonding a thermoelectric element to the first electrically conductive trace. After bonding the thermoelectric element to the first electrically conductive trace, a metal post may be formed on the thermoelectric element so that the thermoelectric element is between the first electrically conductive trace and the metal post. After forming the metal post, the metal post may be bonded to a second electrically conductive trace so that the metal post is between the second electrically conductive trace and the thermoelectric element. Other related methods and structures are also discussed.

7 Claims, 8 Drawing Sheets

(56) References Cited

U.S. PATENT DOCUMENTS

| | | | |
|---|---|---|---|
| 4,459,428 A * | 7/1984 | Chou | 136/211 |
| 4,468,854 A * | 9/1984 | Chou et al. | 438/55 |
| 4,855,810 A | 8/1989 | Gelb et al. | |
| 5,006,178 A | 4/1991 | Bijvoets | |
| 5,254,178 A | 10/1993 | Yamada et al. | |
| 5,429,680 A * | 7/1995 | Fuschetti | 136/203 |
| 5,430,322 A | 7/1995 | Koyanagi et al. | |
| 5,824,561 A * | 10/1998 | Kishi et al. | 438/55 |
| 5,837,929 A | 11/1998 | Adelman | |
| 5,865,975 A | 2/1999 | Bishop | |
| 5,869,242 A | 2/1999 | Kamb | |
| 5,874,219 A | 2/1999 | Rava et al. | |
| 5,900,071 A | 5/1999 | Harman | |
| 5,922,988 A | 7/1999 | Nishimoto | |
| 6,060,331 A | 5/2000 | Shakouri et al. | |
| 6,060,657 A | 5/2000 | Harman | |
| 6,062,681 A | 5/2000 | Field et al. | |
| 6,071,351 A | 6/2000 | Venkatasubramanian | |
| 6,072,925 A | 6/2000 | Sakata | |
| 6,075,280 A * | 6/2000 | Yung et al. | 257/620 |
| 6,084,050 A | 7/2000 | Ooba et al. | |
| 6,094,919 A | 8/2000 | Bhatia | |
| 6,100,463 A * | 8/2000 | Ladd et al. | 136/201 |
| 6,154,266 A | 11/2000 | Okamoto et al. | |
| 6,154,479 A | 11/2000 | Yoshikawa et al. | |
| 6,180,351 B1 | 1/2001 | Cattell | |
| 6,271,459 B1 | 8/2001 | Yoo | |
| 6,282,907 B1 | 9/2001 | Ghoshal | |
| 6,300,150 B1 * | 10/2001 | Venkatasubramanian | 438/27 |
| 6,365,821 B1 | 4/2002 | Prasher | |
| 6,384,312 B1 | 5/2002 | Ghoshal et al. | |
| 6,388,185 B1 * | 5/2002 | Fleurial et al. | 136/205 |
| 6,403,876 B1 | 6/2002 | Ghoshal et al. | |
| 6,410,971 B1 | 6/2002 | Otey | |
| 6,412,286 B1 | 7/2002 | Park et al. | |
| 6,452,206 B1 * | 9/2002 | Harman et al. | 257/22 |
| 6,505,468 B2 | 1/2003 | Venkatasubramanian | |
| 6,605,772 B2 | 8/2003 | Harman et al. | |
| 6,696,635 B2 | 2/2004 | Prasher | |
| 2001/0052234 A1 | 12/2001 | Venkatasubramanian | |
| 2002/0053359 A1 | 5/2002 | Harman et al. | |
| 2002/0069906 A1 | 6/2002 | Macris | |
| 2002/0139123 A1 | 10/2002 | Bell | |
| 2003/0230332 A1 * | 12/2003 | Venkatasubramanian et al. | 136/205 |
| 2004/0261830 A1 * | 12/2004 | Sharp et al. | 136/201 |
| 2005/0045702 A1 * | 3/2005 | Freeman et al. | 228/254 |
| 2005/0178424 A1 * | 8/2005 | Yotsuhashi et al. | 136/201 |

FOREIGN PATENT DOCUMENTS

| | | |
|---|---|---|
| EP | 0 805 501 | 11/1997 |
| GB | 2 171 254 A | 8/1986 |
| JP | 6-97512 | 4/1994 |
| WO | WO98/43740 | 10/1998 |
| WO | WO98/44562 | 10/1998 |
| WO | WO 99/38219 | 7/1999 |
| WO | 00/49664 | 8/2000 |
| WO | WO 01/08800 | 2/2001 |
| WO | WO 2006/049285 A2 | 5/2006 |
| WO | WO 2006/049285 A3 | 5/2006 |

OTHER PUBLICATIONS

Rama Venkatasubramanian et al; Thin-film thermoelectric devices with high room-temperature figures of merit; Nature; vol. 413 Oct. 11, 2001; XP-001090991 pp. 597-602.

Invitation to Pay Additional Fees and Partial International Search Report for PCT/US2006/024387 mailed Jul. 26, 2007.

International Search Report and Written Opinion for PCT/US2006/024387; Oct. 22, 2007.

Development of Low-Bandgap Ge and $SI_{0.07}Ge_{0.03}$ Solar Cells for Monolithic and Mechanically-Stacked Cascade Applications, Rama Venkatasubramanian et al., pp. 73-78, (1990).

Fields, S., Proteomics in Genomeland, Science vol. 291 No. 5507 pp. 1221-1224, pp. 1-7, (Apr. 5, 2001).

Graded-Band-GAP AlGaAs Solar Cells For AlGaAs/Ge Cascade Cells, M.L. Timmons, et al., pp. 68-72, (1990).

Fitch, J. Patrick, Bahrand Sokhansanj, IEEE, Genomic Engineering: Moving Beyond DNA Sequence to Function, Proceedings of the IEEE, vol. 88, No. 12, Dec. 2000, pp. 1949-1971.

Hofmeister, Rudolf et al., New Photorefractive Mechanism in Centrosymmetric Crystals: A Strain-Coordinated Jahn-Teller Relaxation, Physical Review. Letters, vol. 69, No. 9, Aug. 31, 1992, pp. 1459-1462.

Samuel K. Moore, Making Chips, IEEE Spectrum, Biotechnology, Mar. 2001, pp. 54-60.

Photoexcited Carrier Lifetimes and Spatial Transport in Surface-free GaAS Homostructures, L.M. Smith et al., J. Vac. Sci. Technol. B, vol. 8, No. 4 Jul./Aug. 1990, pp. 787-792.

Ideal Electronic Properties of a p-Ge/p-$Al_{0.85}Ga_{0.15}$AS Interface, Rama Venkatasubramanian et al., Appl. Phys. Lett., vol. 59, No. 3, Jul. 15, 1991, pp. 318-320.

Selective Plasma Etching of Ge Substrates for Thin Freestanding GaAs-AlGaAs Heterostructures, Rama Venkatasubramanian et al., Appl. Phys. Lett., vol. 59, No. 17, Oct. 21, 1991, pp. 2153-2155.

Visible Light Emission From Quantized Planar Ge Structures, Rama Venkatasubramanian et al., Appl. Phys. Lett., vol. 59, No. 13, 23 Sep. 1991, pp. 1603-1605.

GaInAsP Lattice Matched to GaAs for Solar Cell Applications P.R. Sharps, et al., Research Triangle Institute, P.O. Box 12194, RTP, NC 27709. pp. 315-317.

High-Temperature Performance and Radiation Resistance of High-Efficiency Ge and $Si_{0.07}Ge_{0.03}$ Solar Cells on Lightweight Ge Substrates, Rama Venkatasubramanian et al., pp. 85-98.

Physical Basis and Characteristics of Light Emission, From Quantized Planar Ge Structures, Rama Venkatasubramanian, et al., pp. 15.4.1-15.4.4, (1991).

High Quality GaAs on Si Using $Si_{0.04}Ge_{0.96}$/Ge Buffer Layers, Rama Venkatasbramanian, et al., Journal of Crystal Growth 107 (1991) pp. 489-493.

The New Face of A.I., Michael Powell, Merger Maniac Europe's CD Underworld, the Supercheap Future of Flying, Mar. 2002, Hacking the Racetrack, Insife Nuke University, Wired, A New Kind of Cool, Rama Venkatasubramanian.

Optimization of the Heteroepitaxy of Ge on GaAs for Minority-Carrier Lifetime, Rama Venkatasubramanian, et al., Jouranl of Crystal Growth 112 (1991) pp. 7-13, Received Aug. 9, 1990; manuscript received in final form Dec. 14, 1990.

Intrinsic Recombination and Interface Characterization in "surface-free" GaAs Structures, D.J. Wolford et al., J. Vac. Sci. Technol. B. vol. 9, No. 4, Jul./Aug. 1991, pp. 2369-2376.

Advances in the Development of an AlGaAs/GaAs Cascade Solar Cell Using a Patterned Germanium Tunnel Interconnect, Rama Venkatasubramanian et al., pp. 345-354, (1991).

High-Quality Eutectic-Metal-Bonded AlGaAs-GaAs Thin Films on SI Substrates, Rama Venkatasubramanian et al., Appl. Phys. Lett., vol. 60, No. 7, 17 Feb. 1992, pp. 886-888.

Photoluminescence of Porous Silicon Buried Underneath Epitaxial GaP, J.C., Campbell, et al., Appl. Phys. Lett., vol. 60, No. 7, Feb. 17, 1992, pp. 889-891.

Interface-Free GaAs Structures—From Bulk to the Quantum Limit, D.J. Wolford, et al, Inst. Phys. Conf. Serial No. 120: Chapter 9, pp. 401-406, (1992).

Properties and Use of Cycled Grown OMVPE GaAs: Zn, GaAS:Se, and GaAS:Si Layers for High-Conductance GaAS Tunnel Junctions, Rama Venkatasubramanian et al., National Renewable Energy Laboratory, Golden, CO 80401, pp. 893-899, (1991).

Thermal Characterization of $Bi_2, Te_3/Sb_2\ Te_3$ Superlattices, M.N. Touzelbaev and P. Zhou, Department of Mechanical Engineering, Stanford University, Stanford, California 94305-3030, Rama Venkatasubramanian, Center for Semiconductor Research, Research Triangle Institute, Research Triangle Park, Durham, NC 27709-2195, K.E. Goodson Electronic mail goodson@vk.stanford.edu, Journal of Applied Physics, vol. 90, No. 2, Jul. 15, 2001, pp. 763-767.

(56) References Cited

OTHER PUBLICATIONS

Smaller, Faster, Efficient Thermoelectric Cooling, Rama Venkatasubramanian, vol. 30, No. 41, Oct. 17, 2001 ISSN: 0300-757X, pp. 1-2,.
CVD Diamond for Components and Emitters, J. Davidson, Corresponding Author, e-mail address: jld@vuse.vanderbilt.edu (J. Davidson) et al., Vanderbilt University 2201 West End Avenue, Nashville, TN 37235, USA, Diamond and Related Materials 10 (2001) pp. 1736-1742.
Sneak Preview, Optical Device Transfers Data Fast, Rama Venkatasubramanian, design news Dec. 17, 2001, p. 14.
Lattice Thermal Conductivity Reduction and Phonon Localization-like Behavior in Superlattice Structures, Rama Venkatasubramanian, Research Triangle Institute, Research Triangle Park, North Carolina 27709, Physical Review B., vol. 61, No. 4, Jan. 15, 2000-II, pp. 3091-3097.
Phonon-Blocking Electron-Transmitting Structures, Rama Venkatasubramanian et al., Research Triangle Institute, Research Triangle Park, NC, USA, 18 International Conference on Thermoelectric (1999), pp. 100-103.
Magnetoresistance Technique for Determining Cross-Plane Mobility in Superlattice Devices, S.W. Johnson et al., National Renewable Energy Laboratory, Golden, Co, USA, Research Triangle Institute, Research Triangle Park, NC, USA, 18th International Conference on Thermoelectrics (1999), pp. 675-686.
RTI Research Yields Major Advance in Thermoelectrics, Rama Venkatasubramanian et al., pp. 8-9.
RTI International, "New Thermoelectric Materials Can Keep Chips Cool Advances in Fiber Optics and in Biotechnology also are Likely" Oct. 9, 2001.
RTI International Annual Report 2001, Turning Knowledge into Practice, pp. 4-37.
Cooling Film Tempers Tiny Hot Spots, Rama Venkatasubramanian et al, Science News, No. 3, 2001, V160, i18, p. 280.
Phonon Blocking Electron Transmitting Superlattice Structures as Advanced Thin Film Thermoelectric Materials, Materials, Rama Venkatasubramanian, Research Triangle Institute, Research Triangle Park, NC, Chaster 4, Semiconductors and Semimetals, vol., pp. 175-201, (2001).
Improved Photoluminescence of GaAs in ZnSe/GaAs Heterojunctions grown by Organometallic Epitaxy, S.K. Ghandhi et al., Electrical Computer, and Systems Engineering Department, Rensselaer Polytechnic Institute, Troy, New York 12180, Appl. Phys. Lett. vol. 53 No. 14, Oct. 3, 1988, pp. 1308-1310.
Epitaxy of Germanium using Germane in the Presence of Tetramethylgermanium, Rama Venkatasubramanian et al., Research Triangle Institute, P.O. Box 12194, Research Triangle Park, NC, 27709, J. Appl. Phys. vol.. 66, No. 11, Dec. 1, 1989, pp. 5662-5664.
Radiative Recombination in Surface free n$^+$In$^-$In$^+$GaAs Homostructures, L.M. Smith and D.J. Wolford et al., Appl. Phys. Lett., vol. 57, No. 15, Oct. 8, 1990, pp. 1572-1574.
Measurement of Al/GaAs/AlGaAs Interface Recombination Velocities Using Time-Resolved Photoluminescence, M.L. Timmons, et al., Appl. Phys. Lett. vol. 56, No. 19, May 7, 1990, pp. 1850-1852.
Thin-Film Thermoelectric Devices with High Room-Temperature Figures of Merit, Rama Venkatasubramanian et al., Research Triangle Institute, Research Triangle Park, North Carolina 27709, USA, 2001 Macmillian Magazines Lt., Nature, vol. 413, Oct. 11, 2001, www.nature.com pags 597-602.
In-situ Monitoring of the Growth of $Bi_2 Te_3$ and $Sb_2 Te_3$ Superlattice Using Spectroscopic Ellipsometry Hao Cui et al. Journal of Electronic Materials, vol. 30, No. 11 2001, Special Issue Paper, pp. 1376-1381.
Incorporation Processes in MBE Growth of ZnSe, Rama Venkatasubramanian et al., Jouranl of Crystal Growth 95 (1989) pp. 533-537.
An Inverted-Growth Approach to Development of an IR-Transparent, High-Efficiency AiGaAs/GaAs Cascade Solar Cell, Rama Venkatasubramanian, M.L. Timmons, T.S. Colpitts, J.S. Hills, and J.A. Hutchby, Research Triangle Institute, Research Triangle Park, NC 27709, 1991 IEEE pp. 93-98.
15.8%-Efficient (1-SUN, AM 1.5G) GaAs Solar Cell on Optical-Grade Polycrystalline Ge Substrate, Rama Venkatasubramanian et al., pp. 691-695, (1993).
Development of 20% Efficient GaInAsP Solar Cells, P.R. Sharps, et. al., 1993 IEEE pp. 633-638.
Development of High-Efficiency $Al_{0.2}Ga_{0.8}As$ Solar Cells and Interconnect Schemes For $Al_{0.2}Ga_{0.3}As$/Si Mechanically-Stacked Cascade Cells, Rama Venkatasubramanian, et al., 1993 IEEE pp. 752-756.
Photorefledtance Charaterization of InP and GaAs Solar Cells, R.G. Rodrigues et al., 1993 IEEE pp. 681-685.
Close-Packed Cell Arrays for Dish Concentrators, J.B. Lasich et al., Solar Research Corporation Pty. Ltd., 6 Luton Lane, Hawthorn, Victoria 3122, Australia and M. Timmons et al., Research Triangle Institute, RTP, USA, 1994 IEEE pp. 1938-1941.
GaAs and $Al_{0.2}Ga_{0.8}As$ Solar Cells With an Indirect-Bandgap $Al_{0.8}Ga_{0.2}As$ Emitter—Heterojunction Cells, Rama Venkatasubramanian et al., Research Triangle Institute, RTP, NC 27709, H. Field and K. Emery, National Renewable Energy Laboratory (NREL), Golden, CO 80401, First WCPEC: Dec. 5-9, 1994; Hawaii, pp. 1839-1842.
The Growth and Radiation Response of N$^+$p Deep Homojunction InP Solar Cells, M.J. Panunto et al., M.L. Timmons, et al., First WCPEC; Dec. 5-9, 1994; Hawaii, pp. 2192-2195.
Material and Device Characterization Toward High-Efficiency GaAs Solar Cells on Optical-Grade Polycrystalline Ge Substrates, Rama Venkatasubramanian, et al., R. Ahrenkiel, et. al, First WCPEC; Dec. 5-0, 1994; Hawaii, 1994 IEEE pp. 1692-1696.
Silicon and GAAS/GE Concentrator Power Plants: A Comparison of Cost of Energy Produced, R.A. Whisnant et al., First WCPEC; Dec. 5-9, 1994; Hawaii, 1994 IEEE pp. 1103-1106.
Compensation Mechanisms in N$^+$-GaAs Doped With Silicon, Rama Venkatasubramanian, et al., Electrical Computer, and Systems Engineering Department, Rensselaer Polytechnic Institute, Troy, New York 12180, USA, Journal of Crystal Growth 94 (1989) pp. 34-40.
High-Efficiency Tandem Solar Cells on Single-and Poly-Crystalline Substrates, J.A. Hutchby et al., Center for Semiconductor Research, Research Triangle Institute, Research Triangle Park, NC 27709, USA, Solar-Energy Materials and Solar Cells 35 (1994) pp. 9-24.
Optoelectronic Properties of Eutectic-Metal-Bonded (EMB) GaAs-AlGaAs Structures on Si Substrates, Rama Venkatasubramanian, et al., Solid-State Electronics vol. 37, No. 11, pp. 1809-1815, 1994.
Heteroepitaxy and Characterization of Ge-rich SiGe Alloys on GaAs, Rama Venkatasubramanian et al., J. Appl. Phys. vol. 69. No. 12, Jun. 15, 1991, pp. 8164-8167.
18.2% (AM1.5) Efficient GaAs Solar Cell on Optical-Grade Polycrystalline Ge Substrate, Rama Venkatasubramanian et al., 25th PVSC; May 13-17, 1996; Washington, D.C. 1996 IEEE pp. 31-36.
Experimental Evidence of High Power Factors and Low Thermal Conductivity in $Bi_2Te_3$/$SB_2Te_3$Superlattice Thin-Films, Rama Venkatasubramanian et al., Research Triangle Institute, Research Triangle Park, NC 27709, USA, 15th International Conference on Thermoelectrics (1996), 1996 IEEE pp. 454-458.
Thermal Conductivity of Si-Ge Superlattices, S.-M. Lee and David G. Cahill[a], Rama Venkatasubramanian, Appl. Phys. Lett. vol. 70, No. 22, Jun. 2, 1997, pp. 2957-2959.
20% (AM1.5) Efficiency GaAs Solar Cells on Sub-mm Grain-Size Poly-Ge and Its Transition to Low-Cost Substrates, Rama Venkatasubramanian et al., 26th PVSC: Sep. 30-Oct. 3, 1997; Anaheim, CA 1997 IEEE, pp. 811-814.
Electronic and Mechanical Properties of Ge Films Grown on Glass Substrates, R.K. Ahrenkiel et al., 26th PVSC; Sep. 30-Oct. 3, 1997; Anaheim, CA, pp. 527-529.
MOCVD of $Bi_2 Te_3$ and Their Superlattice Structures for Thin-Film Thermoelectric Applications, Rama Venkatasubramanian et al., Journal of Crystal Growth 170 (1997), pp. 817-821.
A Silent Cool: Thermoelectrics May Offer New Ways to Refrigerate and Generate Power, Corinna Wu, Science News, Sep. 6, 1997 v152 n10 p. 152(2), pp. 1-3.

(56) References Cited

OTHER PUBLICATIONS

ONR Contributes to Thermoelectric Research (Office of Naval Research) (Brief Article), Ozone Depletion Network Online Today, Contact ONR, website http://www.onr.navy.mil., Nov. 2001.

In-Plane Thermoelectric Properties of Freestanding Si/Ge Superlattice Structures, Rama Venkatasubramanian et al., 17$^{th}$ International Conference on Thermoelectrics (1998), pp. 191-197.

Potential of Si-based Superlattice Thermoelectric Materials for Integration with Si Microelectronics, Rama Venkatasubramanian et al., 1998 IEEE, p. 869.

Low-temperature Organometallic Epitaxy and Its Application to Superlattice Structures in Thermoelectrics, Rama Venkatasubramanian, a), et al., Sandra Liu and Nadia El-Masry, Michael Lamvik, Applied Physics Letters, vol. 75, No. 8, Aug. 23, 1999, pp. 1104-1106.

Optical Constants of $Bi_2Te_3$ and $Sb_2Te_3$ Measured Using Spectroscopic Ellipsometry, HAO CUI,[1] I.B. BHAT[1,3] and Rama Venkatasubramanian[2], 1-Electrical, Computer and Systems Engineering Department, Rensselaer Polytechnic Institute, Troy, NY 12180-3590, USA. 2.-Research Triangle Institute, Research Triangle Park, NC 27709, USA, 3-e-mail:bhati@.rpi.edu., Journal of Electronics Materials, vol. 28, No. 10, 1999, pp. 1111-1114.

Thin-Film Technology, Research Triangle Institute, Investment Opportunities, in Thermoelectronics, Apr. 6, 2001, website http://www.rti.org/units/es.cfm, pp. 1-2.

Nature Publishing Group, Materials Update, Cool Future for Semiconductors, Oct. 11, 2001. pp. 1-3.

Cool New Film, Science Update, Oct. 11, 2001, http://www.nature.com/nsu/011011/0111011-12.html, pp. 1-2.

Semiconductors are Cool, News and Views, Cronin B. Vining, 2001 Macmillan Magazines Ltd., Nature, vol. 413, Oct. 11, 2001, www.nature.com, pp. 577-578.

Thermoelectric Boost, Richard Babyak, Appliance Manufacturer, Design and Engineering Solutions for the Global Appliance Industry, http://www.ammagazine.com/CDA/ArticleInformation/features/BNP Features Item/0.260 . . . Jul. 18, 2002, pp. 1-2.

Thermoelectrics, from Hot to Cool, New Technology Offers Efficient way to Heat or Cool ICS in Operation, Jeff Dorsch, Semiconductor Magazine, http://www.semi.org/web/wmagazine.nsf/4f55b97743c2d02e882565bf006c2459/27e74866ea . . . , Jun. 20, 2002, pp. 1-3.

Nanostructured Superlattice Thin-Film Thermoelectric Devices; Nanotechnology and the Environment Applications and Implications; American Chemical Society (2005) (ACS Symposium Series 890) Chapter 47, pp. 347-352.

Grove issues power warning at IEDM lunch; David Lammers (Dec. 10, 2002) http://www.eetimes.com/showArticle.jhtml?articleID=10806530,; EETIMES online.

Superlattice Thin-film Thermoelectric Materials and Devices; Rama Venkatasubramanian et al.; Mat. Res. Soc. Symp. Proc. vol. 793 (2004 Materials Research Society) pp. 51-58.

1.3 Peltier Cooling and the Thermoelectric Figure of Merit; G.S. Nolas et al.; Thermo-electrics Basic Principles and New Materials Developments; Materials Science; pp. 8-13.

IR-Mediated PCR http://faculty.virginia.edu/landers/lrframe.htm.

\* cited by examiner

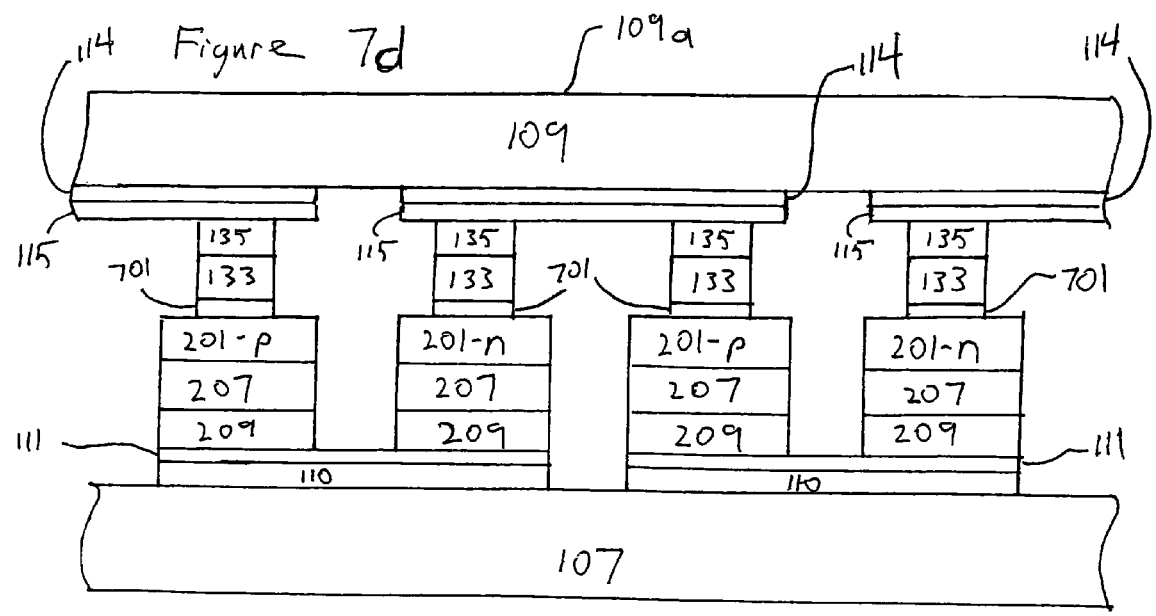

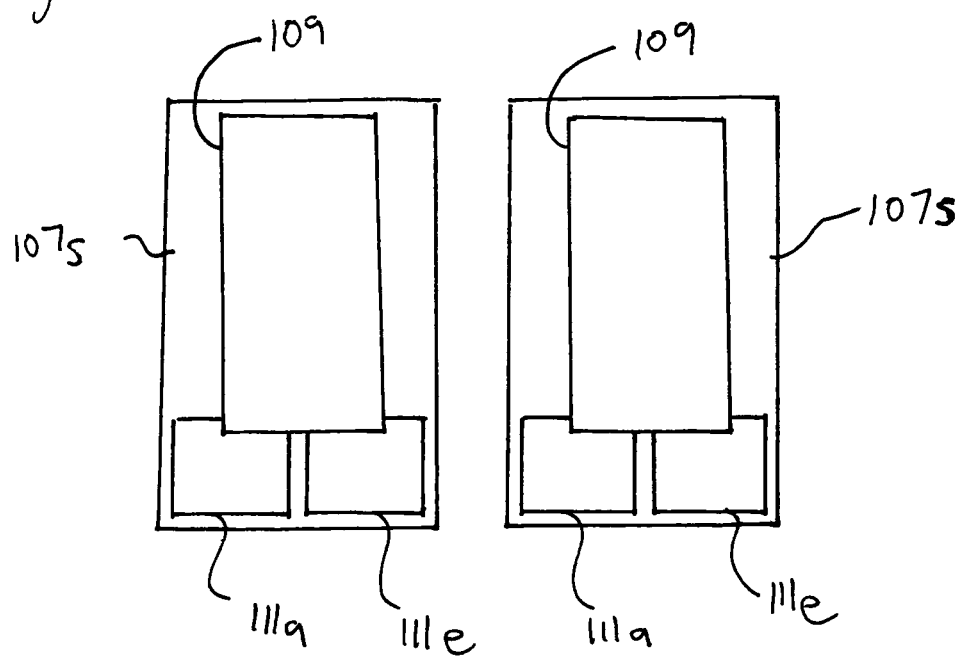

METHODS OF FORMING THERMOELECTRIC DEVICES INCLUDING CONDUCTIVE POSTS AND/OR DIFFERENT SOLDER MATERIALS AND RELATED METHODS AND STRUCTURES

RELATED APPLICATIONS

The present application claims the benefit of priority from U.S. Provisional Application No. 60/692,864 filed Jun. 22, 2005, the disclosure of which is hereby incorporated herein in its entirety by reference.

FIELD OF THE INVENTION

The present invention relates to the field of electronics, and more particularly to thermoelectric device structures and related methods.

BACKGROUND

Thermoelectric materials may be used to provide cooling and/or power generation according to the Peltier effect. Thermoelectric materials are discussed, for example, in the reference by Venkatasubramanian et al. entitled "*Phonon-Blocking Electron-Transmitting Structures*" (18$^{th}$ International Conference On Thermoelectrics, 1999), the disclosure of which is hereby incorporated herein in its entirety by reference.

Application of solid state thermoelectric cooling may be expected to improve the performance of electronics and sensors such as, for example, RF receiver front-ends, infrared (IR) imagers, ultra-sensitive magnetic signature sensors, and/or superconducting electronics. Bulk thermoelectric materials typically based on p-$Bi_xSb_{2-x}Te_3$ and n-$Bi_2Te_{3-x}Se_x$ alloys may have figures-of-merit (ZT) and/or coefficients of performance (COP) which result in relatively poor thermoelectric device performance.

The performance of a thermoelectric device may be a function of the figure(s)-of-merit (ZT) of the thermoelectric material(s) used in the device, with the figure-of-merit being given by:

$$ZT = (\alpha^2 T/\sigma K_T),\qquad\text{(equation 1)}$$

where $\alpha$, T, $\sigma$, $K_T$ are the Seebeck coefficient, absolute temperature, electrical conductivity, and total thermal conductivity, respectively. The material-coefficient Z can be expressed in terms of lattice thermal conductivity ($K_L$), electronic thermal conductivity ($K_e$) and carrier mobility (i), for a given carrier density ($\mu$) and the corresponding $\alpha$, yielding equation (2) below:

$$Z = \alpha^2\sigma/(K_L+K_e) = \alpha^2/[K_L/(\mu\rho q)+L_0 T)],\qquad\text{(equation 2)}$$

where, $L_0$ is the Lorenz number (approximately $1.5\times10^{-8} V^2/K^2$ in non-degenerate semiconductors). State-of-the-art thermoelectric devices may use alloys, such as p-$Bi_xSb_{2-x}Te_{3-y}Se_y$ (x≈0.5, y≈0.12) and n-$Bi_2(Se_yTe_{1-y})_3$ (y≈0.05) for the 200 degree K to 400 degree K temperature range. For certain alloys, $K_L$ may be reduced more strongly than $\mu$ leading to enhanced ZT.

A ZT of 0.75 at 300 degree K in p-type $Bi_xSb_{2-x}Te_3$ (x≈1) was reported forty years ago. See, for example Wright, D. A., Nature vol. 181, pp. 834 (1958). Since then, there has been relatively modest progress in the ZT of thermoelectric materials near 300 degree K (i.e., room temperature). A ZT of about 1.14 at 300 degree K for bulk p-type $(Bi_2Te_3)_{0.25}(Sb_2Te_3)_{0.72}(Sb_2Se_3)_{0.03}$ alloy has been discussed for example, in the reference by Ettenberg et al. entitled "*A New N-Type And Improved P-Type Pseudo-Ternary $(Bi_2Te_3)(Sb_2Te_3)(Sb_2Se_3)$ Alloy For Peltier Cooling*," (Proc. of 15$^{th}$ Inter. Conf. on Thermoelectrics, IEEE Catalog. No. 96TH8169, pp. 52-56, 1996), the disclosure of which is hereby incorporated herein in its entirety by reference.

Notwithstanding the above mentioned advances in thermoelectric materials, there continues to exist a need in the art for improved thermoelectric device structures and assembly methods.

SUMMARY

According to some embodiments of the present invention, a method of forming a thermoelectric device may include forming a first electrically conductive trace, and bonding a thermoelectric element to the first electrically conductive trace. After bonding the thermoelectric element to the first electrically conductive trace, a metal post may be formed on the thermoelectric element so that the thermoelectric element is between the first electrically conductive trace and the metal post. After forming the metal post, the metal post may be bonded to a second electrically conductive trace so that the metal post is between the second electrically conductive trace and the thermoelectric element.

Bonding the thermoelectric element to the first electrically conductive trace may include providing a first solder material between the thermoelectric element and the first electrically conductive trace and reflowing the first solder material. Bonding the metal post to the second electrically conductive trace may include providing a second solder material between the metal post and the second electrically conductive trace and reflowing the second solder material. Moreover, the first and second solder materials may be different. More particularly, the first solder material may have a first reflow temperature, and the second solder material may have a second reflow temperature less than the first reflow temperature. In addition, the metal post may have a thickness of at least about 15 μm (micrometers) between the thermoelectric element and the second electrically conductive trace.

The thermoelectric element may be a first thermoelectric element, and the metal post may be a first metal post. In addition, a second thermoelectric element may be bonded to the first electrically conductive trace, and the first and second thermoelectric elements may have different conductivity types. After bonding the first and second thermoelectric elements to the first electrically conductive trace, a second metal post may be formed on the second thermoelectric element so that the second thermoelectric element is between the second metal post and the first electrically conductive trace. After forming the first and second metal posts, the second metal post may be bonded to a third electrically conductive trace so that the metal post is between the third electrically conductive trace and the second metal post.

Forming the first electrically conductive trace may include forming the first electrically conductive trace on a first header. In addition, a third electrically conductive trace may be formed on a second header before bonding the second metal post to the third electrically conductive trace. Moreover, the thermoelectric element may include a superlattice of alternating layers of at least two different thermoelectric materials.

According to some other embodiments of the present invention, a method of forming a thermoelectric device may include forming a first electrically conductive trace. A thermoelectric element may be bonded to the first electrically conductive trace using a first solder layer having a first reflow temperature so that the first solder layer is between the thermoelectric element and the first electrically conductive trace. The thermoelectric element may be bonded to a second electrically conductive trace using a second solder layer having a second reflow temperature different than the first reflow temperature so that the thermoelectric element is between the first and second electrically conductive traces. The first and second solder layers comprise different materials.

Bonding the thermoelectric element to the first electrically conductive trace may precede bonding the thermoelectric element to the second electrically conductive trace, and the first reflow temperature may be greater than the second reflow temperature. After bonding the thermoelectric element to the first electrically conductive trace, a metal post may be formed on the thermoelectric element. Moreover, bonding the thermoelectric element to the second electrically conductive trace may include bonding the metal post to the second electrically conductive trace using the second solder layer so that the metal post is between the thermoelectric element and the second solder layer. The metal post may have a thickness of at least about 15 µm (micrometers).

The thermoelectric element may include a first thermoelectric element. In addition, a second thermoelectric element may be bonded to the first electrically conductive trace using a third solder layer, and reflow temperatures of the first and third solder layers may be the same. Moreover, the first and second thermoelectric elements have different conductivity types. The second thermoelectric element may be bonded to a third electrically conductive trace using a fourth solder layer so that the second thermoelectric element is between the first and third electrically conductive traces.

Forming the first electrically conductive trace may include forming the first electrically conductive trace on a header. In addition, the second electrically conductive trace may be formed on a second header before bonding the thermoelectric element to the second electrically conductive trace. Moreover, the thermoelectric element may include a superlattice of alternating layers of at least two different thermoelectric materials.

According to still other embodiments of the present invention, a method of forming a thermoelectric device may include forming a thermoelectric element on a substrate wherein the thermoelectric element and the substrate have aligned crystal structures, and wherein the thermoelectric element and the substrate comprise different materials. An electrically conductive trace may be formed on a header. After forming the thermoelectric element and after forming the electrically conductive trace, the thermoelectric element may be bonded to the electrically conductive trace so that the thermoelectric element is between the electrically conductive trace and the substrate.

Sidewalls of the thermoelectric element may be offset relative to sidewalls of the substrate. Moreover, the thermoelectric element may be a first thermoelectric element and wherein the substrate may be a first substrate. In addition, a second thermoelectric element may be formed on a second substrate. The second thermoelectric element and the substrate may have aligned crystal structures, the second thermoelectric element and the second substrate may include different materials, and the first and second thermoelectric elements may have opposite conductivity types. After forming the second thermoelectric element and after forming the electrically conductive trace, the second thermoelectric element may be bonded to the electrically conductive trace so that the second thermoelectric element is between the electrically conductive trace and the second substrate.

Bonding the thermoelectric element may include bonding the thermoelectric element to the electrically conductive trace using a solder layer. Moreover, the thermoelectric element may include a superlattice of alternating layers of at least two different thermoelectric materials.

The substrate may be an element substrate, and forming the thermoelectric element on the substrate may include forming a thermoelectric element layer on a growth substrate. After forming the thermoelectric element layer, portions of the thermoelectric element layer may be etched to define the thermoelectric element on the growth substrate with exposed portions of the growth substrate surrounding the thermoelectric element. The growth substrate may then be diced to separate the element substrate and the thermoelectric element thereon. Moreover, dicing the growth substrate may include dicing portions of the growth substrate that are spaced apart from the thermoelectric element.

According to yet other embodiments of the present invention, a method of forming a thermoelectric device structure may include forming a first header including a plurality of first patterns of electrically conductive traces thereon, and forming a plurality of second headers with each of the plurality of second headers including a second pattern of electrically conductive traces thereon. A plurality of thermoelectric elements may be formed, and each of the second headers may be aligned with a respective one of the first patterns of electrically conductive traces. Thermoelectric elements of the plurality of thermoelectric elements may be electrically coupled between respective first and second patterns of electrically conductive traces.

A plurality of metal posts may be formed with each metal post being formed on a respective thermoelectric element, and each of the metal posts may have a thickness of at least about 15 µm (micrometers). Electrically coupling the thermoelectric elements may include bonding the thermoelectric elements to traces of the first patterns of electrically conductive traces using a first solder material, and bonding the thermoelectric elements to traces of the second patterns of electrically conductive traces using a second solder material. Moreover, the first and second solder materials have different reflow temperatures. More particularly, a reflow temperature of the first solder material may be greater than a reflow temperature of the second solder material.

The plurality of thermoelectric elements may include a plurality of pairs of thermoelectric elements of opposite conductivity type. A respective one of the plurality of pairs of thermoelectric elements may be electrically coupled to at least one of the plurality of electrically conductive traces of each of the first patterns of electrically conductive traces. Each of the plurality of thermoelectric elements may include a superlattice of alternating layers of at least two different thermoelectric materials.

According to additional embodiments of the present invention, a thermoelectric device may include a first electrically conductive trace and a thermoelectric element on the first electrically conductive trace. A metal post may be on the thermoelectric element so that the thermoelectric element is between the metal post and the first electrically conductive trace, and the metal post has a thickness of at least about 15 µm (micrometers). A solder layer may be provided on the metal post with the metal post being between the solder layer and the thermoelectric element. A second electrically conductive trace may be on the solder layer so that the solder layer is between the second electrically conductive trace and the metal post.

The solder layer may include a first solder layer, and a second solder layer may be between the thermoelectric element and the first electrically conductive trace. Moreover, the first and second solder layers comprise different materials and different reflow temperatures. More particularly, a reflow temperature of the first solder layer may be less than a reflow temperature of the second solder layer.

The thermoelectric element may be a first thermoelectric element, the metal post may be a first metal post, and the solder layer may be a first solder layer. In addition, a second thermoelectric element may be on the first electrically conductive trace, and the first and second thermoelectric elements may have different conductivity types. A second metal post may be on the second thermoelectric element so that the second thermoelectric element is between the second metal post and the first electrically conductive trace, and the second metal post may have a thickness of at least about 15 μm (micrometers). A second solder layer may be on the second metal post, and the second metal post may be between the second solder layer and the second thermoelectric element. A third electrically conductive trace may be on the second solder layer so that the second solder layer is between the third electrically conductive trace and the second metal post.

A first header may be on the first electrically conductive trace with the first electrically conductive trace between the thermoelectric element and the first header. A second header may be on the second electrically conductive trace with the second electrically conductive trace between the metal post and the second header. Moreover, the thermoelectric element may include a superlattice of alternating layers of at least two different thermoelectric materials.

According to yet additional embodiments of the present invention, a thermoelectric device may include a first electrically conductive trace, and a first solder layer on the first electrically conductive trace. A thermoelectric element may be on the first solder layer, and the first solder layer may be between the thermoelectric element and the first electrically conductive trace. A second solder layer may be on the thermoelectric element, the thermoelectric element may be between the first and second solder layers, and the first and second solder layers may have different reflow temperatures. A second electrically conductive trace may be on the second solder layer so that the second solder layer is between the second electrically conductive trace and the thermoelectric element.

A metal post may be between the thermoelectric element and the second solder layer, and the metal post may have a thickness of at least about 15 μm (micrometers). The first and second solder layers may be different materials, and a reflow temperature of the first solder layer may be greater than a reflow temperature of the second solder layer.

The thermoelectric element may be a first thermoelectric element. A third solder layer may be on the first electrically conductive trace, and reflow temperatures of the first and third solder layers may be the same. A second thermoelectric element may be on the third solder layer, the first and second thermoelectric elements may have different conductivity types, and the third solder layer may be between the first electrically conductive trace and the second thermoelectric element. A fourth solder layer may be on the second thermoelectric element, and the second thermoelectric element may be between the first and second solder layers. A third electrically conductive trace may be on the fourth solder layer so that the fourth solder layer is between the third electrically conductive trace and the fourth solder layer.

A first header may be on the first electrically conductive trace with the first electrically conductive trace between the thermoelectric element and the first header. A second header may be on the second electrically conductive trace with the second electrically conductive trace between the second solder layer and the second header. Moreover, the thermoelectric element may include a superlattice of alternating layers of at least two different thermoelectric materials.

According to more embodiments of the present invention, a thermoelectric device structure may include a header and an electrically conductive trace on the header. A thermoelectric element may be on the electrically conductive trace with the thermoelectric element having a crystal structure. In addition, a substrate may be on the thermoelectric element, and the substrate may have a crystal structure aligned with the crystal structure of the thermoelectric element, and the substrate and the thermoelectric element may include different materials.

Moreover, sidewalls of the thermoelectric element may be offset relative to sidewalls of the substrate. The thermoelectric element may include a first thermoelectric element, and the substrate may include a first substrate. In addition, a second thermoelectric element may be on the electrically conductive trace, the second thermoelectric element may have a crystal structure, and the first and second thermoelectric elements have opposite conductivity types. A second substrate may be on the second thermoelectric element, the second substrate may have a crystal structure aligned with the crystal structure of the second thermoelectric element, and the second substrate and the second thermoelectric element may include different materials.

A solder layer may also be between the electrically conductive trace and the thermoelectric element. Moreover, the thermoelectric element may include a superlattice of alternating layers of at least two different thermoelectric materials.

According to still more embodiments of the present invention, a thermoelectric device structure may include a first header having a plurality of first patterns of electrically conductive traces thereon and a plurality of thermoelectric elements. At least one of the plurality of thermoelectric elements may be electrically coupled to each of the electrically conductive traces of the plurality of first patterns of electrically conductive traces. Each of a plurality of second headers may include a second pattern of electrically conductive traces thereon, and each of the second headers may be aligned with a respective one of the first patterns of electrically conductive traces. At least one of the plurality of thermoelectric elements may be electrically coupled to each of the electrically conductive traces of the second patterns of electrically conductive traces on the respective second headers.

Each of a plurality of metal posts may be between a respective one of the plurality of thermoelectric elements and a respective one of the plurality of second headers, and each of the metal posts may have a thickness of at least about 15 μm (micrometers).

Each of a plurality of first solder layers may be between a respective one of the plurality of thermoelectric elements and the first header, and the plurality of first solder layers include a first solder material. Each of a plurality of second solder layers may be between a respective one of the plurality of thermoelectric elements and a respective one of the second headers. The plurality of second solder layers may include a second solder material, and the first and second solder materials may have different reflow temperatures. More particularly, a reflow temperature of the first solder material may be greater than a reflow temperature of the second solder material.

The plurality of thermoelectric elements may include a plurality of pairs of thermoelectric elements of opposite conductivity type, and a respective one of the plurality of pairs of thermoelectric elements may be electrically coupled to at least one of the plurality of electrically conductive traces of each of the first patterns of electrically conductive traces. Moreover, each of the plurality of thermoelectric elements may include a superlattice of alternating layers of at least two different thermoelectric materials.

BRIEF DESCRIPTION OF THE DRAWINGS

FIGS. 7a-d are cross-sectional views illustrating operations of assembling thermoelectric elements together with first and second headers according to embodiments of the present invention.

FIGS. 8a-c are plan views illustrating operations of assembling thermoelectric elements together with first and second headers according to embodiments of the present invention.

DETAILED DESCRIPTION

Figure 1:
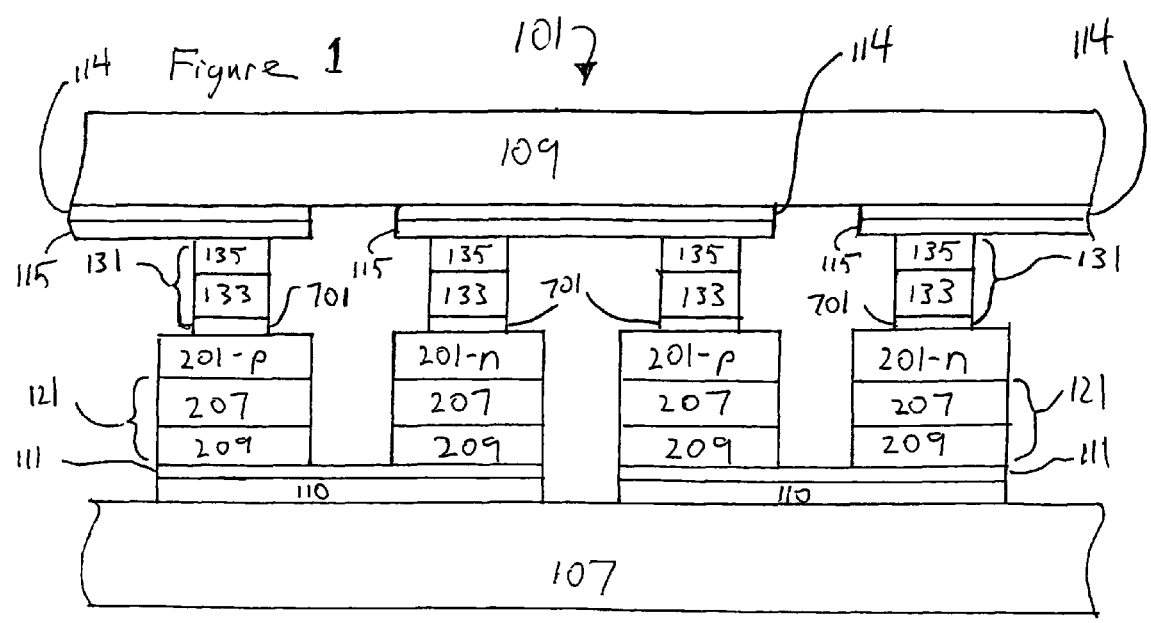
FIG. 1 is a cross-sectional view illustrating thermoelectric device structures according to embodiments of the present invention.

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/ or "comprising," when used in this specification, specify the presence of stated features, integers, steps, operations, elements, and/or components, but do not preclude the presence or addition of one or more other features, integers, steps, operations, elements, components, and/or groups thereof.

Examples of embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

As shown in FIG. 1, a thermoelectric device 101 according to embodiments of the present invention may include a plurality of alternating p-type thermoelectric elements 201-$p$ and n-type thermoelectric elements 201-$n$ electrically coupled in series and thermally coupled in parallel between a first header 107 (also referred to as a primary header) and a second header 109 (also referred to as a secondary header). Metal traces 111 on the first header 107 and metal traces 115 on the second header 109 provide electrical coupling between the p-type and n-type thermoelectric elements 201-$p$ and 201-$n$. Moreover, interconnection layers 121 and 131 provide electrical, mechanical, and/or thermal coupling between the p-type and n-type thermoelectric elements 201-$p$ and 201-$n$ and the metal traces 111 and 115.

The interconnection layers 121 between the thermoelectric elements 201-p and 201-n and the metal traces 111 may include respective seed layers 207 and solder layers 209. The seed layers 207 may include material(s) used to provide a plating base for the solder layers 209. Each seed layer 207, for example, may include an adhesion layer (such as a chromium Cr layer) on the thermoelectric element, a barrier layer (such as a nickel Ni layer) on the adhesion layer, and a passivation layer (such as a gold Au layer) on the nickel layer, so that the adhesion layer is between the barrier layer and the thermoelectric element and so that the adhesion and barrier layers are between the passivation layer and the thermoelectric element. Each solder layer 209 may be a layer of single element solder, a binary solder, a ternary solder, etc.

The interconnection layers 131 between thermoelectric elements 201-p and 201-n and the metal traces 115 may include respective posts 133 and solder layers 135. Each post 133, for example, may include a copper layer on the thermoelectric element, a nickel layer on the copper layer, and a gold layer on the copper layer so that the copper layer is between the nickel layer and the thermoelectric element and so that the copper and nickel layers are between the gold layer and the thermoelectric element. Moreover, each post 133 may have a thickness of at least about 15 μm (micrometer) in a direction between the thermoelectric element and the second header 109. For example, each post 133 may have a thickness in the range of about 15 μm (micrometer) to about 50 μm (micrometer), and more particularly a thickness of about 30 μm (micrometer), in a direction between the thermoelectric element and the second header 109. In addition, a seed layer 701 may be provided between each post 133 and the respective thermoelectric element, and the seed layer 701 may include an adhesion layer (such as a titanium layer) adjacent the thermoelectric element and a conduction layer (such as a copper layer) adjacent the post. In an alternative, the seed layer 701 may include an adhesion layer (such as a chromium layer) adjacent the thermoelectric element, a passivation layer (such as a gold layer) adjacent the post, and a barrier layer (such as a nickel layer) between the adhesion and passivation layers. Each solder layer 135 may be a layer of a single element solder, a binary solder, a ternary solder, etc.

According to some embodiments of the present invention, a first solder material may be used for the solder layers 209, and a second solder material (different than the first solder material) may be used for the solder layers 135. Moreover, the different solder materials may have different melting (reflow) temperatures. The solder layers 209, for example, may have a higher melting (reflow) temperature than the solder layers 135. Accordingly, the thermoelectric elements 201-p and 201-n may be soldered to the first header 107 at a first relatively high temperature using high temperature solder layers 209, and then soldered to the second header 109 at a second relatively low temperature using low temperature solder layers 135 (without melting the high temperature solder layers 209). For example, the solder layers 209 may be layers of tin (Sn), and the solder layers 135 may be layers of indium (In), but other solder layers with different melting temperatures may be used.

Each metal trace 111 on the first header 107 may include a conduction layer (such as a copper layer) on the header 107, a barrier layer (such as a nickel layer) on the conduction layer, and a passivation layer (such as a gold layer) on the barrier layer, so that the conduction layer is between the barrier layer and the header 107, and so that the conduction and barrier layers are between the passivation layer and the header 107. More particularly, the conduction layer may be a copper layer having a thickness of about 30 μm (micrometer), the barrier layer may be a nickel layer having a thickness of about 0.5 μm (micrometer), and the passivation layer may be a gold layer having a thickness of about 0.5 μm (micrometer). In addition, a seed layer 110 may be provided between the metal trace 111 and the first header 107. The seed layer 110, for example, may include an adhesion layer (such as a titanium layer) adjacent the header 107, and passivation layer (such as a gold layer) adjacent the metal trace. In an alternative, the seed layer 110 may include an adhesion layer (such as a titanium layer) adjacent the header 107 and a conduction layer (such as a copper layer) adjacent the metal trace.

Each metal trace 115 on the second header 109 may include a conduction layer (such as a copper layer) on the header 109, a barrier layer (such as a nickel layer) on the conduction layer, and passivation layer (such as a gold layer) on the barrier layer, so that the conduction layer is between the barrier layer and the header 109, and so that the conduction and barrier layers are between the passivation layer and the header 109. More particularly, the conduction layer may be a copper layer having a thickness of about 30 μm (micrometer), the barrier layer may be a nickel layer having a thickness of about 0.5 μm (micrometer), and the passivation layer may be a gold layer having a thickness of about 0.5 μm (micrometer). In addition, a seed layer 114 may be provided between each metal trace 115 and the header 109. The seed layer 114, for example, may include an adhesion layer (such as a titanium layer) adjacent the header 109, and a passivation layer (such as a gold layer) adjacent the metal trace. In an alternative, the seed layer 114 may include an adhesion layer (such as a titanium layer) adjacent the header 109 and a conduction layer (such as a copper layer) adjacent the metal trace.

The first and second headers 107 and 109 may be thermally conductive and electrically insulating. For example, each of the headers 107 and 109 may be a layer of aluminum nitride (AlN). In an alternative, one or both of the headers 107 and 109 may include a layer of an electrically conductive material and a layer of an electrically insulating material between the layer of the electrically conductive material and the respective metal traces 111 and/or 115.

Figure 3A:
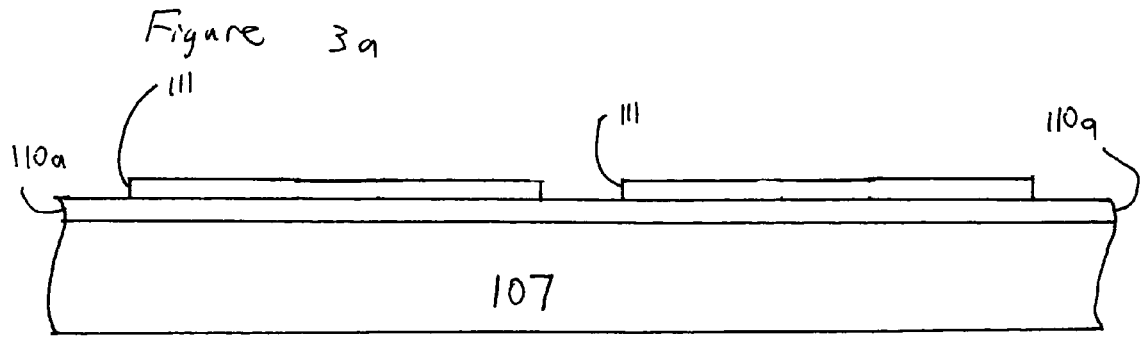
FIGS. 3a-b are cross-sectional views illustrating operations of forming first (primary) headers according to embodiments of the present invention.
Figure 3B:
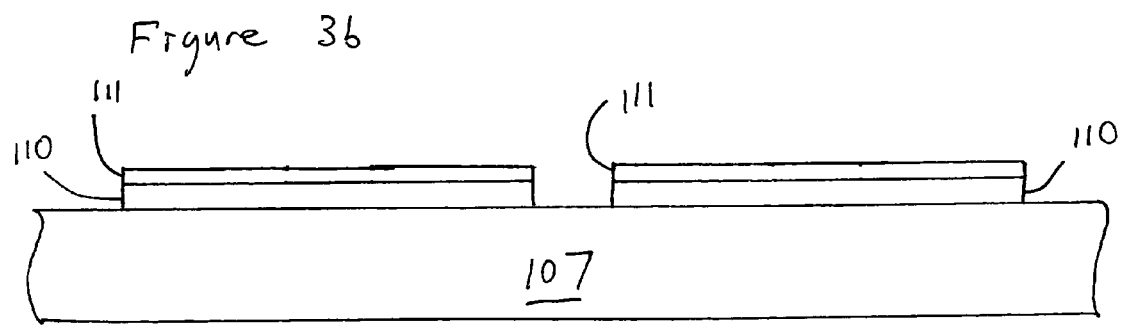
Figure 4A:
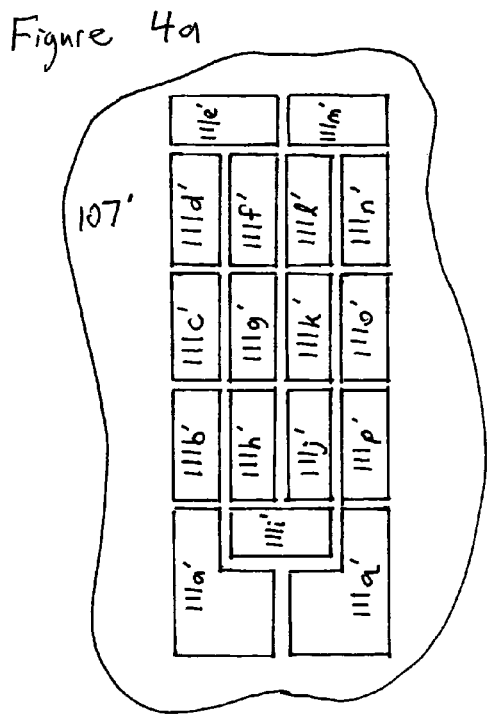
FIGS. 4a-b are plan views illustrating trace patterns for first (primary) headers according to embodiments of the present invention.
Figure 4B:
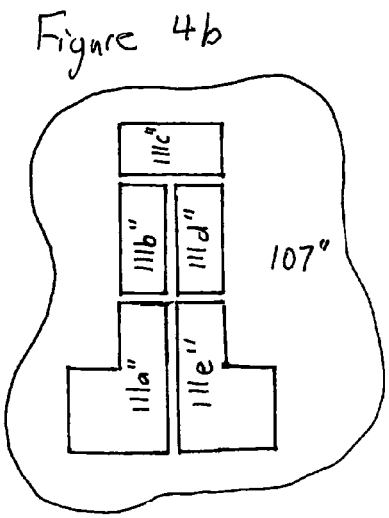
Figure 5A:
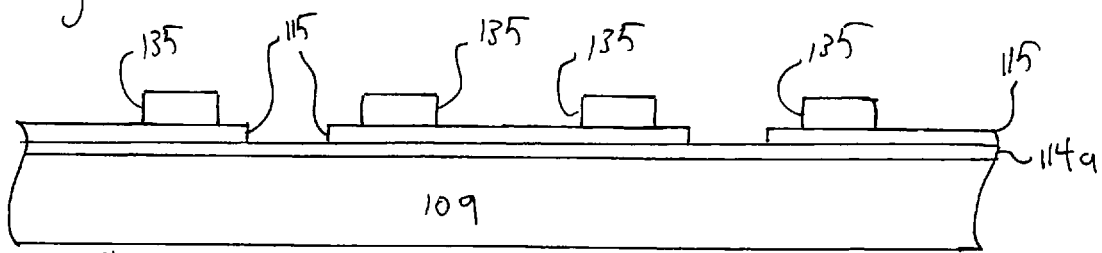
FIGS. 5a-b are cross-sectional views illustrating operations of forming second (secondary) headers according to embodiments of the present invention.
Figure 5B:
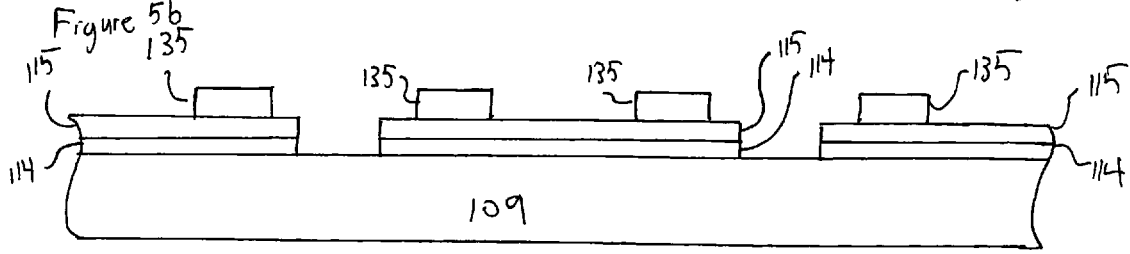
Figure 6A:
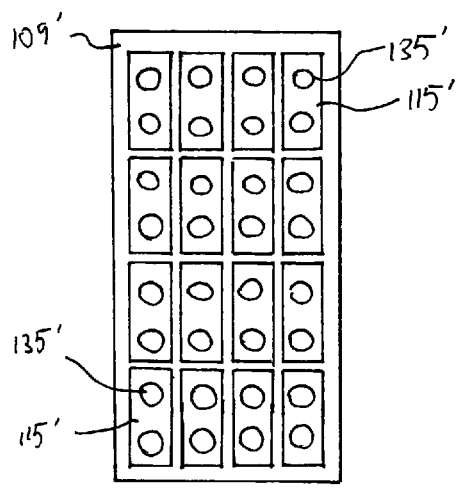
FIGS. 6a-b are plan views illustrating trace patterns for second (secondary) headers according to embodiments of the present invention.
Figure 6B:
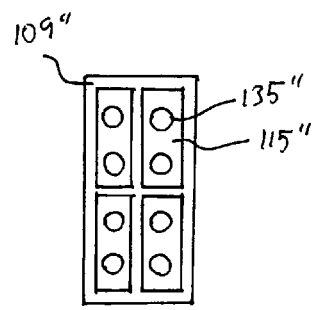

Methods of forming thermoelectric devices according to embodiments of the present invention will now be discussed with respect to FIGS. 2a-c, 3a-b, 4a-b, 5a-b, 6a-b, 7a-d, and 8a-c. More particularly, FIGS. 2a-2c illustrate operations of forming thermoelectric elements, FIGS. 3a-b illustrate operations of forming first (primary) headers, FIGS. 4a-b illustrate trace patterns for first (primary) headers, FIGS. 5a-b illustrate operations of forming second (secondary) headers, FIGS. 6a-b illustrate trace patterns for second (secondary) headers, and FIGS. 7a-d and 8a-c illustrate operations of assembling thermoelectric elements together with first and second headers.

Figure 2A:
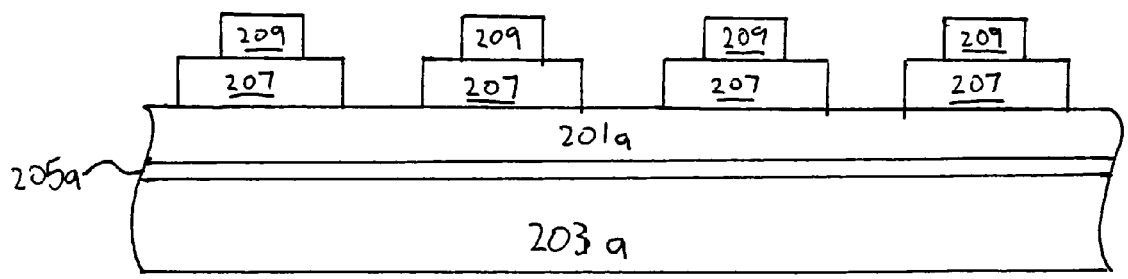
FIGS. 2a-2c are cross-sectional views illustrating operations of forming thermoelectric elements according to embodiments of the present invention.
Figure 2B:
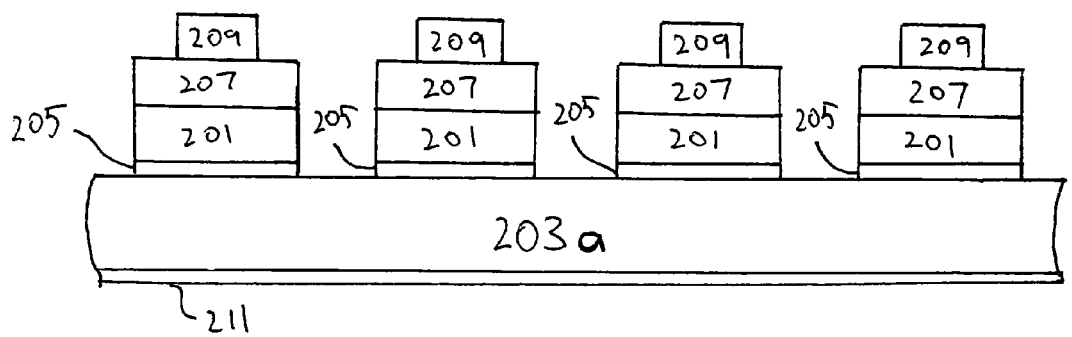
Figure 2C:
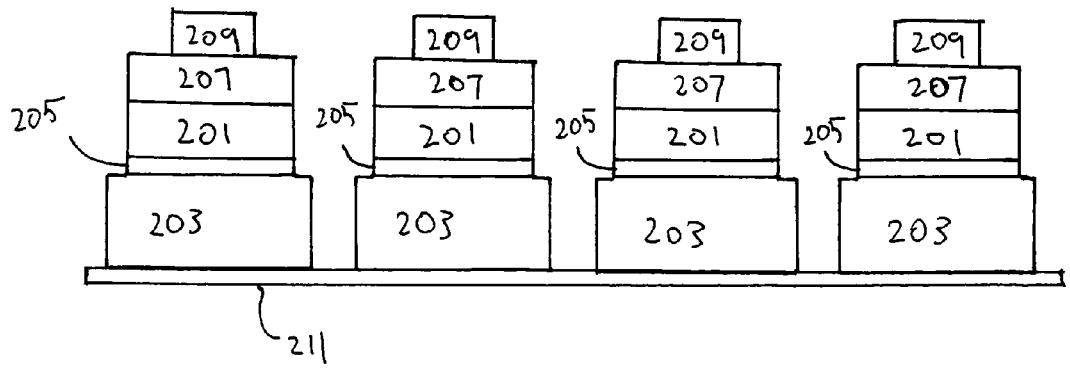

A shown in FIG. 2a, a layer 201a of a thermoelectric material may be grown on a substrate 203a of a different material. Before forming the layer 201a of thermoelectric material, a buffer layer 205a may be formed on the substrate 203a. When forming p-type thermoelectric elements, the layer 201a may be a layer of a p-type thermoelectric material, and when forming n-type thermoelectric elements, the layer 201a may be a layer of an n-type thermoelectric material. Moreover, the buffer layer 205a and the layer 201a of the thermoelectric material may both be epitaxial layers (having a crystal structure aligned with a crystal structure of the substrate 203a), and the layer 201a of the thermoelectric material may be an epitaxial superlattice of alternating layers of two or more different thermoelectric materials.

For example, the layer 201a of a thermoelectric material may include a layer of p-type $Bi_xSb_{2-x}Te_{3-y}Se_y$ (x≈0.5, $y\approx0.12$); a layer of n-type $Bi_2(Se_yTe_{1-y})_3$ ($y\approx0.05$); a layer of p-type $Bi_xSb_{2-x}Te_3$; a layer of n-type $Bi_2Te_{3-x}Se_x$; a layer of a bulk p-type $(Bi_2Te_3)_{0.25}(Sb_2Te_3)_{0.72}(Sb_2Se_3)_{0.03}$ alloy; a p-type superlattice of alternating layers of $Bi_2Te_3$ and $Sb_2Te_3$; an n-type superlattice of alternating layers of $Bi_2Te_3$ and $Bi_2(Te_{1-x}Se_x)_3$; a superlattice of alternating layers of n-PbTe and n-PbTeSe; a superlattice of alternating layers of n-type $Bi_2Te_3$ and n-type $In_xTe_y$; a layer of a p-type alloy of $(Bi_{1-x}Sb_x)_2Te_3$; or a layer of an n-type alloy of $Bi_2(Te_{1-x}Se_x)_3$. The substrate 203a, for example, may be a gallium arsenide (GaAs) substrate.

Thermoelectric superlattice materials and formation thereof are discussed, for example, in the reference by Venkatasubramanian et al. entitled "*Phonon-Blocking Electron-Transmitting Structures*" ($18^{th}$ International Conference On Thermoelectrics, 1999), the disclosure of which is hereby incorporated herein in its entirety by reference. Thermoelectric superlattice materials are also discussed, for example, in U.S. Pat. Nos. 6,722,140; 6,662,570; 6,505,468; 6,300,150; and 6,071,351; the disclosures of which are hereby incorporated herein in their entirety by reference. In addition, thermoelectric superlattice materials are discussed, for example, in U.S. Patent Publication Nos.: 2003/0230332; 2003/0131609; 2003/0126865; 2003/0100137; 2003/0099279; 2002/0174660; and 2001/0052234; the disclosures of which are hereby incorporated herein in their entirety by reference. While epitaxial superlattices of thermoelectric materials are discussed above, other thermoelectric materials may be used. For example, bulk thermoelectric materials may be used.

The buffer layer 205a may be formed of a material different than a material(s) of the epitaxial layer 201a of thermoelectric material. For example, the epitaxial layer 201a may be a superlattice of two or more different theremoelectric materials, and the buffer layer 205a may be a layer of one of the materials of the superlattice. In a later step of removing the substrate 201a from separate thermoelectric elements, the buffer layer 205a may protect growth surfaces of respective thermoelectric elements. After removing the substrate 201a, the buffer layer 205a may be removed to provide improved electrical coupling. Buffer layers are discussed, for example, in U.S. Patent Publication No. 2003/0099279, the disclosure of which is hereby incorporated herein in its entirety by reference.

As further shown in FIG. 2a, seed layers 207 may be formed on the layer 201a of the thermoelectric material, and solder layers 209 may be formed on the seed layers 207. For example, each seed layer 207 may include an adhesion layer (such as a chromium layer) on the layer 201a, a barrier layer (such as a nickel layer) on the adhesion layer, and a passivation layer (such as a gold layer) on the barrier layer, so that the adhesion layer is between the barrier layer and the layer 201a, and so that the adhesion and barrier layers are between the passivation layer and the layer 201a. Each solder layer 209 may be a layer of a single element solder, a binary solder, a ternary solder, etc. For example, each solder layer 209 may be a layer of tin (Sn) having a thickness in the range of about 5 μm (micrometer) to about 10 μm (micrometer).

According to some embodiments of the present invention, a lift-off pattern may be formed on portions of the layer 201a of thermoelectric material with the lift-off pattern exposing portions of the layer 201a on which the seed layer 207 will be formed. The seed layer may then be formed (for example by evaporation) on the lift-off pattern and on exposed portions the layer 201a, and the lift-off pattern may then be removed together with portions of the seed layer thereon. Portions of the seed layer evaporated directly on the layer 201a may remain after removing the lift-off pattern to provide the patterned seed layer 207 shown in FIG. 2a. The solder layers 209 may then be selectively formed on the seed layer 207 (for example, using a plating template that is subsequently removed).

According to some other embodiments of the present invention, a continuous seed layer may be formed on the layer 201a of thermoelectric material, and the solder layers 209 may be formed on the continuous seed layer. For example, the separate solder layers 207 may be selectively formed using a plating template that is subsequently removed. After forming the separate seed layers 207, the continuous seed layer may be patterned (for example, using a photoresist mask and/or the separate solder layers 209 as an etch mask) to provide the separate seed layers 207 shown in FIG. 2a. In an alternative, a continuous solder layer may be formed on the continuous seed layer, and both of the continuous seed and solder layers may be patterned after forming the continuous solder layer (for example, using a single photoresist mask or using separate photoresist masks).

According to still other embodiments of the present invention, the solder layers 207 may be omitted from the layer 201a of thermoelectric material, and solder may instead be provided on the first (primary) header as discussed in greater detail below. The seed layer 207 (without solder formed thereon) may thus provide a solderable surface for connection to metal traces of a first (primary) header using solder provided on the metal traces of the first (primary) header.

A mesa etch mask may then be provided on the seed layers 207 and/or solder layers 209 to selectively expose portions of the layer 201a of the thermoelectric material between the seed layers 207. A mesa etch (for example, using a wet chemical etch) may then be performed on exposed portions of the layer 201a to provide separate thermoelectric elements 201 on the substrate 203a and the mesa etch mask may then be removed to provide the structure illustrated in FIG. 2b. In an alternative, the seed layers 207 and/or the solder layers 209 may be used to mask the layer 201a during the mesa etch without using a separate mesa etch mask. According to some embodiments of the present invention, a surface of each thermoelectric element 201 (in a plane parallel to a surface of the substrate 203a and perpendicular with respect to the cross sectional view of FIG. 2b) may be substantially square with dimensions of about 600 μm (micrometer) by about 600 μm (micrometer). After the mesa etch, a dicing film 211 may be applied to a back surface of the substrate 203a.

The substrate 203a may then be diced (for example, using a dicing saw) to provide separate thermoelectric elements 201 on separate diced portions 203 of the substrate, and the separate elements may be maintained on the dicing film 211 for subsequent pick-and-place operations. By separating the thermoelectric elements 201 using a mesa etch before dicing the substrate 203a, damage to the thermoelectric elements 201 may be reduced and/or a quality of the thermoelectric elements 201 may be improved. Because a spacing between thermoelectric elements 201 (determined by the mesa etch mask and mesa etch) is greater than a spacing between diced portions 203 of the substrate (determined by the dicing operation), contact between a dicing saw (or other dicing equipment) and the thermoelectric elements 201 may be reduced and/or eliminated. Accordingly, edges/sidewalls of the thermoelectric elements 201 may be offset relative to edges/sidewalls of the respective diced portions 203 of the substrate.

P-type thermoelectric elements 201 formed form a p-type thermoelectric layer 201a may thus be used to provide p-type thermoelectric elements 201-p as discussed above with respect to FIG. 1. Similarly, n-type thermoelectric elements 201 formed from an n-type thermoelectric layer 201a may thus be used to provide n-type thermoelectric elements 201-*n* as discussed above with respect to FIG. 1. During subsequent assembly steps, the portions 203 of the substrate may be removed (for example, after soldering the thermoelectric elements to a first or primary header). By maintaining the portions 203 of the substrate until after a later assembly step, the portions 203 of the substrate may aid in handling of the thermoelectric elements and/or protect the thermoelectric elements.

Many separate thermoelectric elements 201 of a same conductivity type (i.e., p-type or n-type) may thus be formed on a same substrate 203*a*, and then separated using mesa etch and dicing operations as discussed above. Accordingly, one or a plurality of substrates may be used to form p-type thermoelectric elements, and one or a plurality of substrates may be used to form n-type thermoelectric elements, and separately formed p-type and n-type thermoelectric elements can then be assembled into a same thermoelectric device as discussed in greater detail below.

FIGS. 3*a*-3*b* are cross-sectional views illustrating steps of forming metal traces 111 on a first (primary) header 107 according to embodiments of the present invention. The header 107, for example, may be a layer of a thermally conductive and electrically insulating material, such as aluminum nitride (AlN). In an alternative, portions of the header 107 may be thermally conductive with a layer of insulating material thereon to provide electrical isolation between electrically conductive traces on the header.

As shown in FIG. 3*a*, a continuous seed layer 110*a* may be formed on the header 107. The continuous seed layer 110*a*, for example, may include an adhesion layer (such as a titanium layer) on the header 107 and a conduction layer (such as a copper layer) on the adhesion layer so that the adhesion layer is between the conduction layer and the header 107. Metal traces 111 may then be selectively formed on the continuous seed layer 110*a*. For example, a plating mask may be formed on the continuous seed layer 110*a*, the metal traces 111 may be selectively plated on exposed portions of the continuous seed layer 110*a*, and the plating mask may then be removed.

The metal traces 111, for example, may include a conduction layer (such as a copper layer) on the continuous seed layer 110*a*, a barrier layer (such as a nickel layer) on the conduction layer, and a passivation layer (such as a gold layer) on the barrier layer, so that the conduction layer is between the barrier layer and the continuous seed layer 110*a*, and so that the conduction and barrier layers are between the passivation layer and the continuous seed layer 110*a*. More particularly, the conduction layer may be a copper layer having a thickness of about 30 μm (micrometer), the barrier layer may be a nickel layer having a thickness of about 0.5 μm (micrometer), and the passivation layer may be a gold layer having a thickness of about 0.5 μm (micrometer).

Portions of the continuous seed layer 110*a* between the metal traces 111 may then be removed to provide the separate seed layers 110 as shown in FIG. 3*b*. As discussed above with respect to FIG. 2*c*, solder layers 209 may be provided on the thermoelectric elements 201 for subsequent solder bonding of thermoelectric elements 201 to the metal traces 111. Accordingly, the metal traces 111 may be free of solder prior to bonding the thermoelectric elements 201 thereto.

In an alternative, solder may be provided on the metal traces 111 prior to bonding the thermoelectric elements 201, with the thermoelectric elements 201 being free of solder prior to bonding with the traces. If solder is to be provided on the traces 111 prior to bonding the thermoelectric elements, a solder plating mask may be formed on the metal traces 111 and the continuous seed layer 110*a*, with the solder plating mask exposing portions of each of the metal traces 111 for plating of solder. Solder may then be plated on the exposed portions of the metal traces, and the solder plating mask may be removed. Separate solder layers may thus be provided on each of the metal traces to provide separate connection to p-type and n-type thermoelectric elements thereon.

FIGS. 4*a* and 4*b* illustrate examples of plan views of patterns of metal traces 11 on first (primary) headers 107' for respective thermoelectric devices according to embodiments of the present invention. As shown in FIG. 4*a*, 17 metal traces 111*a*'-111*q*' on the header 107' for a single thermoelectric device may be configured to receive 32 different thermoelectric elements (16 p-type thermoelectric elements and 16 n-type thermoelectric elements) formed as discussed above with respect to FIGS. 2*a*-2*c*. More particularly, each of the interior traces 111*b*'-111*p*' may receive one n-type thermoelectric element and one p-type thermoelectric element, and the terminal traces 111*a*' and 111*q*' may each have a single thermoelectric element of opposite conductivity types (e.g., one n-type thermoelectric element on terminal trace 111*a*' and one p-type thermoelectric element on terminal trace 111*q*').

As shown in FIG. 4*b*, 5 metal traces 111*a*"-111*e*" on the header 107" for a single thermoelectric device may be configured to receive 8 different thermoelectric elements (4 p-type thermoelectric elements and 4 n-type thermoelectric elements) formed as discussed above with respect to FIGS. 2*a*-2*c*. More particularly, each of the interior traces 111*b*"-111*d*" may receive one n-type thermoelectric element and one p-type thermoelectric element, and the terminal traces 111*a*" and 111*e*" may each have a single thermoelectric element of opposite conductivity types (e.g., one n-type thermoelectric element on terminal trace 111*a*" and one p-type thermoelectric element on terminal trace 111*e*").

Moreover, a single first (primary) header 107 may include trace patterns for a plurality of different thermoelectric devices, so that the single first header 107 may provide a common substrate for batch assembly of multiple thermoelectric devices. A single header, for example, may include a plurality of the traces patterns illustrated in FIG. 4*a* for batch assembly of a plurality of thermoelectric devices with each device including 16 p-type thermoelectric elements and 16 n-type thermoelectric elements. In an alternative, a single header may include a plurality of the traces patterns illustrated in FIG. 4*b* for batch assembly of a plurality of thermoelectric devices with each device including 4 p-type thermoelectric elements and 4 n-type thermoelectric elements. Once assembly of the components of the plurality of thermoelectric devices on the first (primary) header has been completed, the individual thermoelectric devices may be separated by singulating (e.g., cutting) the header 107.

FIGS. 5*a*-5*b* are cross-sectional views illustrating steps of forming metal traces 115 on a second (secondary) header 109 according to embodiments of the present invention. The header 109, for example, may be a layer of a thermally conductive and electrically insulating material, such as aluminum nitride (AlN). In an alternative, portions of the header 109 may be thermally conductive with a layer of insulating material thereon to provide electrical isolation between electrically conductive traces on the header.

As shown in FIG. 5*a*, a continuous seed layer 114*a* may be formed on the header 109. The continuous seed layer 114*a*, for example, may include an adhesion layer (such as a titanium layer) on the header 109 and a conduction layer (such as a copper layer) on the adhesion layer so that the adhesion layer is between the conduction layer and the header 109.

Metal traces 115 may then be selectively formed on the continuous seed layer 114a. For example, a plating mask for the traces may be formed on the continuous seed layer 114a, the metal traces 115 may be selectively plated on exposed portions of the continuous seed layer 114a, and the plating mask for the traces may then be removed.

The metal traces 115, for example, may include a conduction layer (such as a copper layer) on the continuous seed layer 114a, a barrier layer (such as a nickel layer) on the conduction layer, and a passivation layer (such as a gold layer) on the barrier layer, so that the conduction layer is between the barrier layer and the continuous seed layer 114a, and so that the conduction and barrier layers are between the passivation layer and the continuous seed layer 114a. More particularly, the conduction layer may be a copper layer having a thickness of about 30 μm (micrometer), the barrier layer may be a nickel layer having a thickness of about 0.5 μm (micrometer), and the passivation layer may be a gold layer having a thickness of about 0.5 μm (micrometer).

Solder layers 135 may then be selectively formed on the metal traces 115. For example, a plating mask for the solder layers may be formed on the continuous seed layer 114a and on the metal traces 115, the solder layers 135 may be selectively plated on exposed portions of the metal traces 115, and the plating mask for the solder layers may then be removed. Each solder layer 135 may be a layer of a single element solder, a binary solder, a ternary solder, etc. The solder layers 135 may include a solder material different than the solder material used for the solder layers 209 discussed above with respect to FIGS. 2a-2c so that the solder layers 135 and 209 have different melting (reflow) temperatures. The solder layers 209, for example, may have a higher melting (reflow) temperature than the solder layers 135 so that thermoelectric elements may be soldered to the first header 107 at a first relatively high temperature using high temperature solder layers 209, and then soldered to the second header 109 at a second relatively low temperature using low temperature solder layers 135 (without melting the high temperature solder layers 209). For example, the solder layers 135 may be layers of indium (In), and the solder layers 209 may be layers of tin (Sn).

Portions of the continuous seed layer 114a between the metal traces 115 may then be removed to provide the separate seed layers 114 as shown in FIG. 5b. In an alternative, solder layers 135 may be provided on the thermoelectric elements 201 for subsequent solder bonding of thermoelectric elements 201 to the metal traces 115. Accordingly, the metal traces 115 may be free of solder prior to bonding the thermoelectric elements 201 thereto.

The second (secondary) header 109 may then be singulated (for example, by cutting) to provide separate headers for separate thermoelectric devices. FIGS. 6a and 6b illustrate examples of plan views of patterns of metal traces 115 and solder layers 135 on individual second (secondary) headers 109 (after singulation) for respective thermoelectric devices according to embodiments of the present invention.

More particularly, the second header 109' pattern of traces 115' and solder layers 135' of FIG. 6a corresponds to the trace pattern of first header 107' of FIG. 4a for a thermoelectric device including 16 p-type thermoelectric elements and 16 n-type thermoelectric elements. As shown in FIG. 6a, 16 metal traces 115' on the header 109' for a single thermoelectric device may be configured to receive 32 different thermoelectric elements (16 p-type thermoelectric elements and 16 n-type thermoelectric elements formed as discussed above with respect to FIGS. 2a-2c) on respective solder layers 135'. More particularly, one n-type thermoelectric element and one p-type thermoelectric element may be soldered to each metal trace 115'.

The second header 109" pattern of traces 115" and solder layers 135" of FIG. 6b corresponds to the trace pattern of first header 107" of FIG. 4b for a thermoelectric device including 4 p-type thermoelectric elements and 4 n-type thermoelectric elements. As shown in FIG. 6b, 4 metal traces 115" on the header 109" for a single thermoelectric device may be configured to receive 8 different thermoelectric elements (4 p-type thermoelectric elements and 4 n-type thermoelectric elements formed as discussed above with respect to FIGS. 2a-2c) on respective solder layers 115". More particularly, one n-type thermoelectric element and one p-type thermoelectric element may be soldered to each metal trace 115".

A single substrate/header may include trace patterns for a plurality of different thermoelectric devices, so that metal traces and solder layers for a plurality of second headers 109 may be formed simultaneously on a same substrate/header. After forming the metal traces 115 and/or solder layers 135, second headers 109 may be singulated from the common substrate before bonding with thermoelectric elements. A discussed above with respect to FIGS. 3a-b and 4a-b, a plurality of first headers 107 may be maintained on a common substrate to facilitate batch processing of a plurality of thermoelectric devices.

Figure 7A:
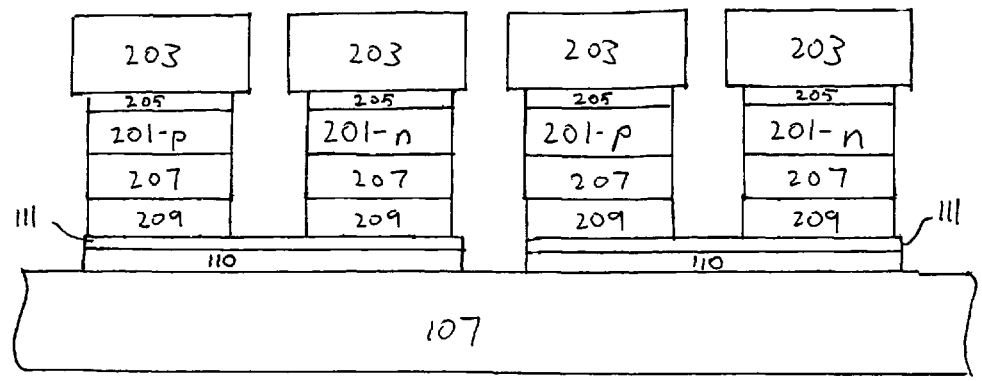

Operations of assembling first and second headers as discussed above with respect to FIGS. 3b and 5b together with p-type and n-type thermoelectric elements as discussed above with respect to FIG. 2c will be discussed below with reference to the cross-sectional views of FIGS. 7a-7b. As shown in FIG. 7a, p-type and n-type thermoelectric elements 201-p and 201-n (together with respective seed layers 207, solder layers 209, and remaining portions of growth substrates 203) may be removed from respective dicing films 211 and placed on traces 111. Once the p-type and n-type thermoelectric elements 201-p and 201-n have been placed, a reflow operation may be performed to provide an electrical and mechanical connection between the thermoelectric elements 201-p and 201-n and the metal traces 111 using solder layers 209.

The p-type thermoelectric elements 201-p may be formed from a p-type thermoelectric layer(s) on a growth substrate(s) as discussed above with respect to FIGS. 2a-2c. Similarly, the n-type thermoelectric elements 201-n may be formed from an n-type thermoelectric layer(s) on a growth substrate(s) as discussed above with respect to FIGS. 2a-2c. A single dicing film may thus be populated with thermoelectric elements of only one conductivity type.

As discussed above, the solder layers 209 may be formed on the respective thermoelectric elements before placement on the traces 111. In an alternative, the solder layers 209 may be formed on the metal traces 111 before placement of the thermoelectric elements 201-p and 201-n thereon.

After soldering the thermoelectric elements to the metal traces as shown in FIG. 7a, the remaining portions 203 of the growth substrates and the buffer layers 205 may be removed from the thermoelectric elements, for example using a chemical etch, thereby exposing growth surfaces of the thermoelectric elements. As shown in FIG. 7b, a conformal plating seed layer 701a may be formed on the first header 107, on the metal traces 111, on the exposed surfaces of the thermoelectric elements 201-p and 201-n, and on exposed sidewalls.

The plating seed layer 701a, for example, may include an adhesion layer (such as a titanium layer) on the thermoelectric elements and a conduction layer (such as a copper layer) on the adhesion layer so that the adhesion layer is between the conduction layer and the thermoelectric elements. In an alternative, the plating seed layer 701a may include an adhesion layer (such as a chromium layer) on the thermoelectric elements, a barrier layer (such as a nickel layer) on the adhesion layer, and passivation layer (such as a gold layer) on the barrier layer, so that the adhesion layer is between the barrier layer and the thermoelectric elements, and so that the adhesion and barrier layers are between the passivation layer and the thermoelectric elements. Moreover, the plating seed layer 701a may be formed by sputtering and/or evaporation.

Figure 7B:
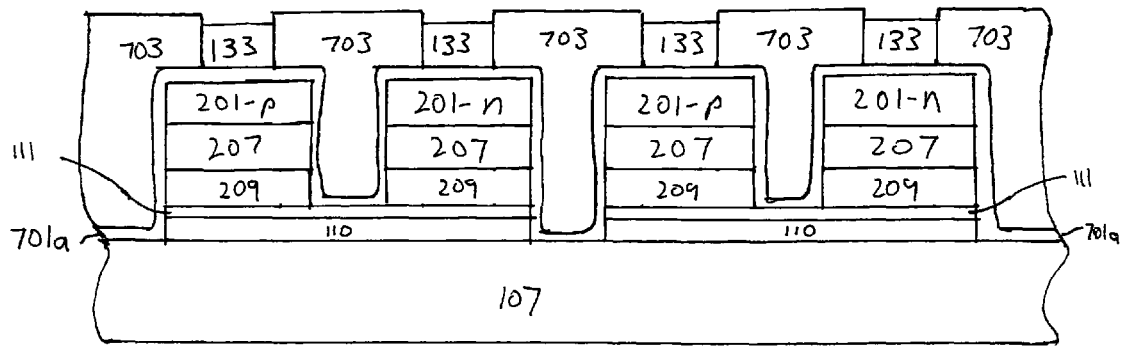

As further shown in FIG. 7b, a plating mask 703 (such as a photoresist mask) may be formed on the plating seed layer 701a, and the plating mask 703 may selectively expose portions of the plating seed layer 701a on the thermoelectric elements 201-p and 201-n. Metal posts 133 may then be plated on exposed portions of the plating seed layer 701a using the plating seed layer 701a as an electroplating electrode. Each metal post 133, for example, may include a conduction layer (such as a copper layer) on the plating seed layer 701a, a barrier layer (such as a nickel layer) on the conduction layer, and a passivation layer (such as a gold layer) on the barrier layer, so that the conduction layer is between the barrier layer and the plating seed layer 701a, and so that the conduction and barrier layers are between the passivation layer and the plating seed layer 701a. More particularly, the conduction layer may be a copper layer having a thickness of about 30 μm (micrometer), the barrier layer may be a nickel layer having a thickness of about 0.5 μm (micrometer), and the passivation layer may be a gold layer having a thickness of about 0.5 μm (micrometer). Each post 133 may thus have a thickness of at least about 15 μm (micrometer) in a direction between the thermoelectric element and the second header 109. For example, each post 133 may have a thickness in the range of about 20 μm (micrometer) to about 40 μm (micrometer), and more particularly a thickness of about 30 μm (micrometer), in a direction between the thermoelectric element and the second header 109.

Figure 7C:
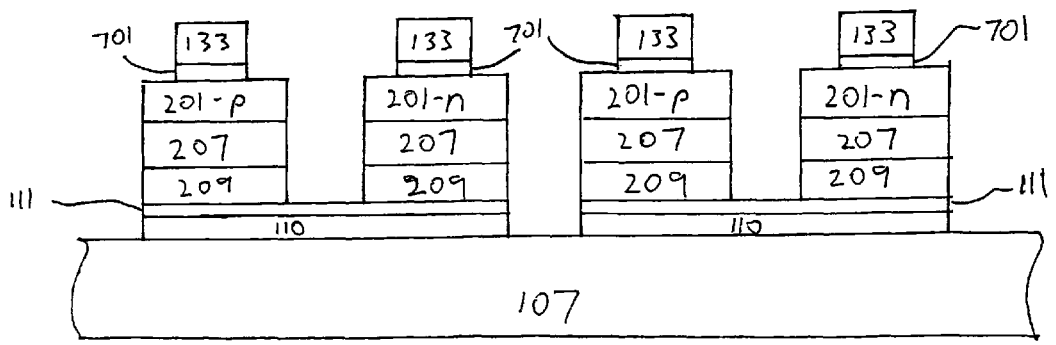

After forming the metal posts 133, the plating mask 703 may be removed, and exposed portions of the plating seed layer 701a may be removed as shown in FIG. 7c. As shown in FIG. 7d, solder layers 135 of the second header of FIG. 5b may then be brought into contact with the with the respective metal posts 133, and a reflow operation may be performed to provide electrical and mechanical connection between the thermoelectric elements 201-p and 201-n and the metal traces 115 using solder layers 135. As discussed above, the solder layers 135 may be provided on the metal traces 115 before contacting the metal posts 133. In an alternative, the solder layers 135 may be formed on the metal posts 133 before contacting the traces 115 of the second header (so that the second header 109 of FIG. 5b may be free of solder layers 135). For example, the plating mask 703 and the plating seed layer 701a of FIG. 7b may be used to plate the solder layers 135 on the metal posts 133.

Figure 8A:
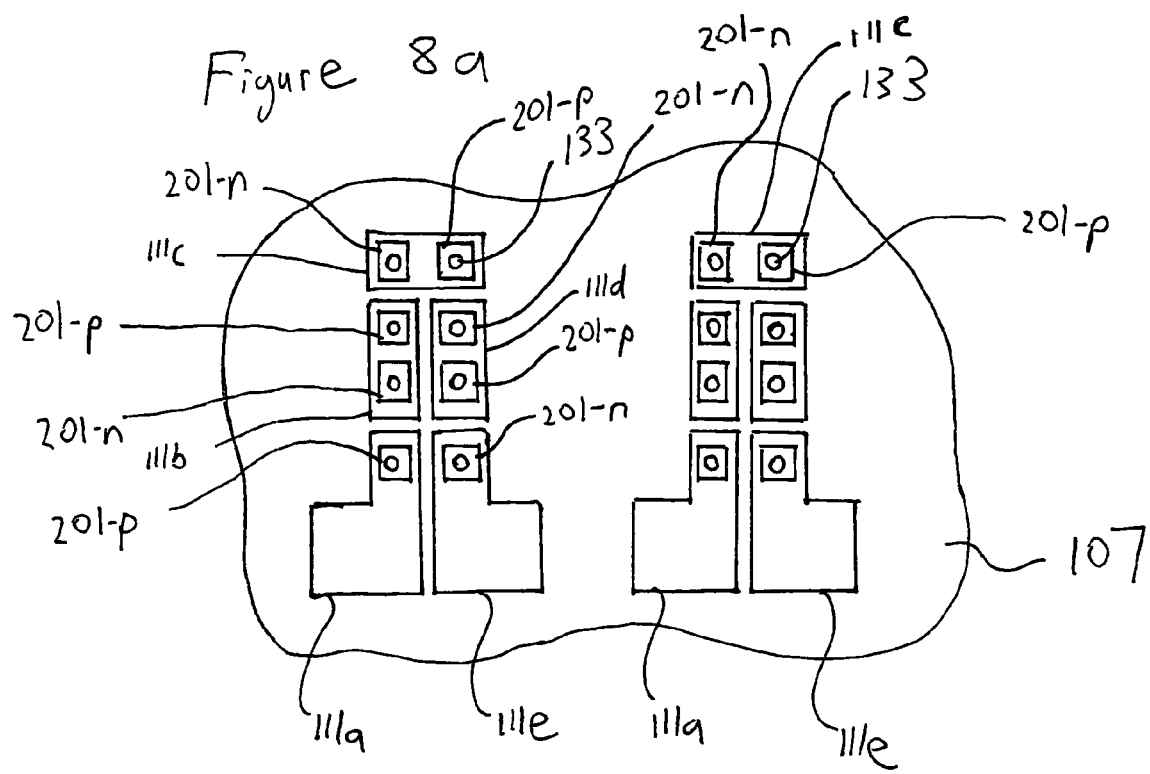
Figure 8B:
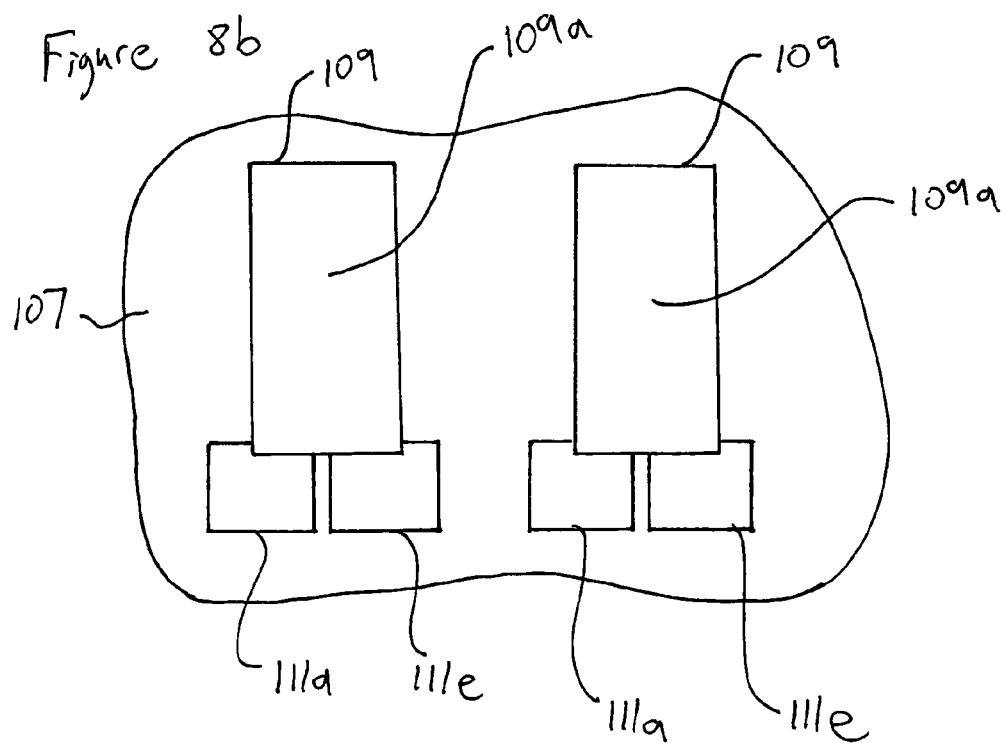

FIGS. 8a-8c are plan views illustrating the final assembly of a first header as shown in FIG. 4b and a second header as illustrated in FIG. 6b to provide a thermoelectric device according to embodiments of the present invention. More particularly, FIG. 8a corresponds to the cross-sectional view of FIG. 7c, and FIG. 8b corresponds to the cross-sectional view of FIG. 7d. FIG. 8c illustrates singulation of the first header to provide a plurality of thermoelectric devices.

As shown in FIG. 8a, patterns of metal traces 111 for a plurality of thermoelectric devices may be formed on a common header 107 (also referred to as a substrate) to facilitate batch assembly operations. As discussed above with respect to FIG. 7c, the n-type thermoelectric elements 201-n and the p-type thermoelectric elements 201-p may be soldered to the traces 111, and the metal posts 133 may be formed on the thermoelectric elements.

The second headers 109 may be previously formed with metal traces and solder thereon and singulated as discussed above with respect to FIG. 4b, and a separate second header 109 may be bonded face down on respective patterns of traces 111 and thermoelectric elements 201-n and 201-p as shown in FIGS. 7d and 8b. Accordingly, the backsides 109a of the second headers 109 are visible in the plan view of FIG. 8b with the thermoelectric elements 201-p and 201-n being sandwiched between the first header 107 and the respective second headers 109.

The first header 107 may then be singulated into a plurality of first headers 107s as shown in FIG. 8c to provide a plurality of separate thermoelectric devices. In each of the thermoelectric devices, portions of the terminal traces 111a and 111e may be exposed to provide electrical coupling to external circuitry such as a controller for a thermoelectric cooling device and/or an electrical storage device and/or load for a thermoelectric power generation device. For a thermoelectric cooling device, one of the headers 107s or 109 may be thermally coupled to a surface to be cooled, and the other header may be thermally coupled to a heat sink. For a thermoelectric power generation device, one of the headers may be coupled to a relatively hot surface and the other of the headers may be coupled to a relatively cool surface.

While device fabrication steps are discussed with respect to FIGS. 8a-8c for thermoelectric devices having header patterns as shown in FIGS. 4b and 6b, the same fabrication steps can be used to fabricate thermoelectric devices having other header patterns such as the patterns illustrated in FIGS. 4a and 6a.

While the present invention has been particularly shown and described with reference to embodiments thereof, it will be understood by those of ordinary skill in the art that various changes in form and details may be made therein without departing from the spirit and scope of the present invention as defined by the following claims.

That which is claimed is:

1. A method of forming thermoelectric devices comprising:
providing a continuous first header including a plurality of first patterns of electrically conductive traces on a surface thereof, wherein the plurality of first patterns are spaced apart and non-overlapping in a direction parallel with respect to the surface of the continuous first header, wherein each of the first patterns of electrically conductive traces includes a plurality of electrically conductive traces, and wherein the first header provides electrical isolation between each of the electrically conductive traces of the first patterns;
providing a plurality of separate second headers with each of the plurality of separate second headers including a respective second pattern of electrically conductive traces thereon, wherein each of the second patterns of electrically conductive traces includes a plurality of electrically conductive traces on the respective second header, and wherein each of the second headers provides electrical isolation between the plurality of electrically conductive traces of the respective second pattern thereon;
aligning each of the separate second headers with a respective one of the first patterns of electrically conductive traces on the continuous first header; and
electrically coupling respective pluralities of thermoelectric elements between respective first and second patterns of electrically conductive traces of the continuous first header and the plurality of separate second headers so that each of the plurality of separate second headers is bonded through a respective one of the pluralities of thermoelectric elements to a respective one of the first patterns of electrically conductive traces on the surface of the continuous first header, wherein each of the separate second headers are spaced apart across the surface of the continuous first header in the direction parallel with respect to the surface of the continuous first header, wherein the separate second headers are non-overlapping in the direction parallel with respect to the surface of the continuous first header, and wherein thermoelectric elements of each plurality of thermoelectric elements are physically between the continuous first header and the respective second header and electrically coupled in series; and after electrically coupling the thermoelectric elements, singulating the continuous first header into a plurality of separate first headers, wherein each one of the separate first headers includes a respective one of the first patterns of electrically conductive traces, and wherein each one of the separate second headers is coupled to a respective one of the plurality of separate first headers to provide a plurality of physically and electrically separate thermoelectric devices.

2. A method according to claim 1 further comprising:
forming a plurality of metal posts wherein each metal post is formed on a respective thermoelectric element, and wherein each of the metal posts has a thickness of at least about 15 μm (micrometers) wherein a structure between each thermoelectric element and the first header is asymmetric with respect to a structure between the thermoelectric element and the respective second header.

3. A method according to claim 1 wherein electrically coupling the thermoelectric elements comprises bonding the thermoelectric elements to traces of the first patterns of electrically conductive traces using a first solder material, and bonding the thermoelectric elements to traces of the second patterns of electrically conductive traces using a second solder material wherein the first and second solder materials have different reflow temperatures.

4. A method according to claim 3 wherein a reflow temperature of the first solder material is greater than a reflow temperature of the second solder material.

5. A method according to claim 1 wherein the plurality of thermoelectric elements comprises a plurality of pairs of thermoelectric elements of opposite conductivity type, wherein a respective one of the plurality of pairs of thermoelectric elements is electrically coupled to at least one of the plurality of electrically conductive traces of each of the first patterns of electrically conductive traces.

6. A method according to claim 1 wherein each of the plurality of thermoelectric elements comprises a superlattice of alternating layers of at least two different thermoelectric materials.

7. A method according to claim 1 wherein each of the second patterns of the second headers are the same.

* * * * *

UNITED STATES PATENT AND TRADEMARK OFFICE
CERTIFICATE OF CORRECTION

| | | |
|---|---|---|
| PATENT NO. | : 8,623,687 B2 | Page 1 of 1 |
| APPLICATION NO. | : 11/472032 | |
| DATED | : January 7, 2014 | |
| INVENTOR(S) | : O'Quinn et al. | |

It is certified that error appears in the above-identified patent and that said Letters Patent is hereby corrected as shown below:

In the Specification:
Column 1, Lines 49 and 50:
   Please correct "conductivity ($K_e$) and carrier mobility (i), for a given carrier density ($\mu$) and the"
          to read -- conductivity ($K_e$) and carrier mobility ($\mu$), for a given carrier density ($\rho$) and the --

Signed and Sealed this
Twenty-third Day of September, 2014

Michelle K. Lee
*Deputy Director of the United States Patent and Trademark Office*